United States Patent [19]

Yamagata et al.

[11] Patent Number: 5,605,558
[45] Date of Patent: Feb. 25, 1997

[54] NITROGENOUS ALUMINUM-SILICON POWDER METALLURGICAL ALLOY

[75] Inventors: Shin-ichi Yamagata; Yoshishige Takano; Tetsuya Hayashi; Yugaku Abe, all of Hyogo, Japan

[73] Assignee: Sumitomo Electric Industries, Ltd., Osaka, Japan

[21] Appl. No.: 334,604

[22] Filed: Nov. 4, 1994

[30]       Foreign Application Priority Data

Nov. 10, 1993  [JP]  Japan ................................. 5-281401
Sep. 1, 1994   [JP]  Japan ................................. 6-208667
Sep. 27, 1994  [JP]  Japan ................................. 6-258704

[51] Int. Cl.$^6$ ............................................. C22C 29/16
[52] U.S. Cl. ................................ 75/230; 75/244; 75/249; 428/548; 428/552
[58] Field of Search ........................... 75/230, 244, 249; 428/548, 551, 552

[56]            References Cited

U.S. PATENT DOCUMENTS 3,262,761  7/1966   Bechtold ............................. 29/182.5
4,867,806  9/1989   Shiina ................................. 148/11.5
4,917,739  4/1990   Adam et al. ........................ 148/437
4,938,810  7/1990   Kiyota et al. ...................... 148/437
4,946,500  8/1990   Zedalis et al. ..................... 75/232
4,963,322  10/1990  Faure ................................. 419/33
5,039,476  8/1991   Adachi et al. ..................... 419/13
5,199,971  4/1993   Akechi et al. ..................... 75/249
5,368,629  11/1994  Kondo et al. ...................... 75/249
5,387,272  2/1995   Kamitsuma et al. ............... 75/230
5,435,825  7/1995   Kusui et al. ....................... 75/232

FOREIGN PATENT DOCUMENTS 0147769  7/1985  European Pat. Off. .
0529520  3/1993  European Pat. Off. .

Primary Examiner—Charles T. Jordan
Assistant Examiner—Chrisman D. Carroll
Attorney, Agent, or Firm—W. G. Fasse; W. F. Fasse

[57]            ABSTRACT

A nitrogenous Al—Si powder metallurgical alloy contains at least 4 wt % and at most 15 wt % of nitrogen, with the remaining part consisting essentially of Al, Si and an unavoidable component. Consequently, a highly safe material which is lightweight and has a density of at most 3.0 g/cm$^3$, a thermal expansion coefficient in the range of 5 to $10\times10^{-6}$/°C., and a thermal conductivity coefficient of at least 0.2 cal/cm·sec·°C. has been obtained.

8 Claims, 11 Drawing Sheets

NITROGENOUS ALUMINUM-SILICON POWDER METALLURGICAL ALLOY

FIELD OF THE INVENTION

The present invention relates to nitrogenous aluminum-silicon powder metallurgical alloys and to a manufacturing method thereof. Such alloys are particularly suitable for use as a heat sink or the like, which is one of the components constituting a semiconductor device.

INFORMATION

In a material constituting a substrate for a semiconductor device, strain must not be generated by thermal stress. Therefore, the material constituting the substrate for a semiconductor device must have a coefficient of thermal expansion not much different from that of the semiconductor element. More specifically, it is required that the substrate has a coefficient of thermal expansion close to the coefficient of thermal expansion of the Si (silicon) or GaAs (gallium arsenic) semiconductor. The thermal expansion of the substrate should further be between the coefficient of thermal expansion of the semiconductor and that of Al (aluminum) or Cu (copper) used as a heat radiator in the semiconductor device.

Recently, the scale and the degree of integration of such semiconductor devices have been increased. Therefore, the material of a semiconductor substrate is required to have an even higher coefficient of thermal conductivity, to function as a heat sink for effectively removing thermal energy from the semiconductor device.

In view of the foregoing, a material having a coefficient of thermal conductivity of at least 0.2 cal/cm·sec·°C. and a coefficient of thermal expansion in the range of $5 \times 10^{-6}$ to $10 \times 10^{-6}$/°C. has been in great demand.

Under these circumstances, materials satisfying the aforementioned conditions include BeO, AlN, Cu—Mo alloy and Cu—W alloy, as shown in FIG. 16. A composite material including SiC having a porous structure impregnated by Al or Al—Si alloy has these properties. Therefore, the use of this composite material for making components for semiconductor devices has been studied. More specifically, such a composite material has a porous structure of 50 to 72 volume % of SiC, 14 to 30 volume % of $Al_2O_3$ and 9 to 20 volume % of a Ni—Si—Al alloy or of an Al—Si alloy being impregnating the porous structure.

Recently, a reduction in weight of various industrial equipments and particularly aerospace and aircraft equipments has been strongly desired. Therefore, a weight reduction of a heat sink is also desired. However, BeO, AlN, Cu—Mo alloy, Cu—W alloy and the aforementioned composite material which are listed as materials having the above described properties (heat conductivity, coefficient of thermal expansion), are limited in their field of application because of the following practical disadvantages.

First, though Cu—Mo alloy and Cu—W alloy have a superior heat conductivity, they have a relatively high specific gravity of 9 to 17 g/cm³. BeO has a small density of 2.9 g/cm³ but cannot be used at present in view of safety and environmental pollution considerations, since BeO is highly toxic. AlN has a relatively small density of 3.3 g/cm³ but machining is difficult, since AlN is a ceramic.

The composite material having an SiC porous structure impregnated with an Al or Al—Si alloy satisfies the above described condition as it has a thermal expansion coefficient within the range of $5 \times 10^{-6}$ to $8 \times 10^{-6}$/°C. and a relatively small density of 3.3 g/cm³. However, this composite material contains not less than 50 volume % of SiC which is a hard ceramic. Therefore, cutting of this composite material is extremely difficult. Further, there are a number of restrictions in manufacturing and in the shapes of products, and therefore the composite material has been not widely used in practice.

As described above, conventionally, a material having a density of at most 3.0 g/cm³, a thermal expansion coefficient of $5 \times 10^{-6}$ to $10 \times 10^{-6}$/°C. and a coefficient of thermal conductivity of at least 0.2 cal/cm·sec·°C., which also satisfies safety and environmental conditions has never been obtained.

Accordingly, when a conventional material is used for a heat sink, at least one of the above described conditions (density, coefficient of thermal conductivity, coefficient of thermal expansion, safety) cannot be satisfied. As a result, in cracks or peeling because of a difference in the coefficients of thermal expansion of the heat sink and the material of another component contacting the heat sink, cannot be avoided. Further, an insufficient heat removal by radiation cannot be avoided because of low coefficient of thermal conductivity. The high density makes a reduction in weight difficult.

Further, a method of manufacturing a material that has all the above described characteristics, and which permit making such a material in a short period of time at low temperatures has not been provided heretofore.

SUMMARY OF THE INVENTION

An object of the present invention is to provide a material that has the following characteristics: a density of at most 3.0 g/cm³, a coefficient of thermal expansion in the range from $5 \times 10^{-6}$ to $10 \times 10^{-6}$/°C., and a coefficient of thermal conductivity of at least 0.2 cal/cm·sec·°C. Further, such a material shall be superior in safety.

Another object of the present invention is to provide a method of manufacturing the material having the above described properties in a short period of time at a low temperatures.

As a result of intensive study for attaining the above described objects, the inventors have found that a nitrogenous aluminum-silicon powder alloy containing at least 4 and at most 15 wt % of nitrogen, with the remainder consisting substantially of Al, Si and unavoidable impurities has the above properties, specifically it has the density of at most 3.0 g/cm³, a coefficient of thermal expansion in the range of $5 \times 10^{-6}$ to $10 \times 10^{-6}$/°C., a coefficient of thermal conductivity of at least 0.2 cal/cm·sec·°C., and a superior safety.

Accordingly, the nitrogenous Al—Si powder metallurgical alloy in accordance with a first aspect of the present invention contains 4 to 15 wt % of nitrogen and its remaining part consists substantially of Al, Si and unavoidable impurities.

Further, as a result of said study, the inventors have found that a nitrogenous Al—Si powder metallurgical alloy containing 4 to 15 wt % of nitrogen, 8.5 to 48 wt % of Si and at most 9.6 wt % of a nitriding assistant element added, which the remainder substantially consisting of Al and an unavoidable impurity, has a density of at most 3.0 g/cm³, a coefficient of thermal expansion in the range of $5 \times 10^{-6}$ to $10 \times 10^{-6}$/cm°C., a coefficient of thermal conductivity of at least 0.2 cal/cm·sec·°C. and a superior safety.

The nitriding assistant element is selected from the group consisting of Li (lithium), Mg (magnesium), Ti (titanium), V (vanadium), Cr (chromium), Mn (manganese), Fe (iron), Co (cobalt), Ni (nickel), Cu (copper), Zn (zinc), Zr (zirconium), Nb (niobium), Mo (molybdenum) and W (tungsten).

In the nitrogenous Al—Si powder metallurgical alloy in accordance with the above described two aspects of the present invention, the content of nitrogen is very important. If the content of nitrogen is smaller than 4 wt %, the coefficient of thermal expansion exceeds $10 \times 10^{-6}/°C$. This results in cracks or peeling due to the difference in the thermal expansion coefficients of the semiconductor device and of the substrate. If the content of nitrogen exceeds 15 wt %, the coefficient of thermal conductivity becomes smaller than 0.2 cal/cm·sec·°C. Therefore, the heat radiation decreases, and the function as a heat sink is degraded.

The nitrogen included in the nitrogenous Al—Si powder metallurgical alloy forms a nitrogenous substance and preferably, at least 90 wt % of the nitride consists of AlN.

At a surface of a rapidly solidified Al—Si alloyed powder, nitride is generated by the reaction between the nitrogen in the atmosphere and the Al—Si alloyed powder during nitriding. This reaction starts from the surface of an Al matrix portion of an Al—Si alloyed powder and nitride is generated on the surface of original powder crystals or in the interface between powder crystal surfaces. The nitride generated in the original powder interface or original powder surface is AlN.

AlN has a density of 3.3 g/cm$^3$, a coefficient of thermal expansion of $4.5 \times 10^{-6}/°C$., and a relatively high coefficient of thermal conductivity. However, the thermal conductivity depends on the concentration of an impurity such as oxygen and on whether there is a crystal lattice strain. Therefore, target properties can be attained by controlling the amount of AlN to be generated in the present alloy. For this purpose, it is necessary that the nitrogen reacts with the Al component to form AlN. When controllability is taken into account, preferably 90 wt % of the nitrogen should be in the form of AlN.

Since the nitrogen content in an alloy according to the present invention is in the range from 4 wt % to 15 wt %, the amount of AlN in the nitrogenous Al—Si powder metallurgical alloy corresponds to 10 wt % to 45 wt %.

AlN which is a nitrogenous substance in the nitrogenous Al—Si powder metallurgical alloy, is not obtained by mixing AlN particles with an Al—Si alloyed powder, but by a reaction of Al—Si alloyed powder in nitrogen. Therefore, as compared with the case in which separately prepared AlN powder is mixed, AlN in the present invention well adheres to the Al matrix. This facilitates the flow of particles when heated, enabling manufacture of homogenous products even when the products have complicated shapes, through hot consolidating such as forging or extrusion. Further, AlN is very fine and dispersed densely in the alloy of the present invention. Therefore, the present nitrogenous Al—Si powder alloy has a superior machinability and a high mechanical strength. Since AlN is generated to coat Al having a low melting point, the nitrogenous Al—Si powder metallurgical alloy of the present invention also has a superior heat resistance.

Though commercially available AlN is expensive, Al is directly nitrided in the present invention, and therefore the nitrogenous Al—Si powder metallurgical alloy of the present invention has a superior advantage from the view of manufacturing cost.

In the method of manufacturing the nitrogenous Al—Si powder metallurgical alloy of the present invention, in addition to Si, at least one element selected from the group consisting of Li, Mg, Ti, V, Cr, Mn, Fe, Co, Ni, Cu, Zn, Zr, Nb, Mo and W is added to the molten Al alloy as a nitriding assistant.

Addition of such element has an effect of nitriding assistant accelerating the nitriding reaction. The reason has not been clarified. However, a possible reason is that elements such as Li or Mg which are highly susceptible to oxidation reduce the oxide film at the surface of Al. Further, since an element having a different coefficient of thermal expansion is added an uneven expansion occurs in the powder, promoting diffusion of nitrogen into the powder. When added, Fe or Ni forms a compound by the reaction with Al, which compound hinders movement of Si particles when heated. Therefore, it can suppress grain growth of Si crystal crystallized or precipitated in an Al matrix during the nitriding reaction.

Since an element promoting the nitriding reaction is added to the alloy metallurgical powder, a nitrogenous Al—Si powder alloy having the desired properties can be obtained by performing a nitriding process on a molded body at a relatively low temperature for a relatively short period of time.

However, if such an element is added to the molten Al alloy, as a weight percentage exceeding 10 wt %, the desired property values (density, coefficient of thermal expansion, coefficient of thermal conductivity) cannot be obtained. Therefore, the amount of such element added to the molten Al alloy must be at most 10 wt %.

Since the added amount of the aforementioned element to the molten Al alloy is at most 10 wt %, the content of the added element in the nitrogenous Al—Si powder metallurgical alloy after nitridation approximately corresponds to at most 9.6 wt %.

The inventors have found that the nitrogenous Al—Si powder metallurgical alloy having the above described properties can be obtained by sintering a molded body of rapidly solidified Al—Si alloyed powder together with nitrogen for 2 to 20 hours in the temperature range of 530° C. to 570° C.

Accordingly, the method of manufacturing the nitrogenous Al—Si powder metallurgical alloy in accordance with one aspect of the present invention includes the following steps.

First, molten Al alloy containing Si is solidified to form rapidly solidified Al—Si alloyed powder. Next, the rapidly solidified Al—Si alloyed powder is subjected to compression molding to obtain a molded body. In an atmosphere containing nitrogen, the molded body is sintered for 2 to 20 hours in a temperature range of 530° C. to 570° C., when no nitriding assistant element is added.

In the method of manufacturing the nitrogenous Al—Si powder metallurgical alloy of the present invention, the temperature and time of nitriding are very important. If the temperature of nitriding is lower then 530° C., the amount of reaction of Al—Si alloyed powder with the nitrogen in the atmosphere is too small, and the nitriding phenomenon is not sufficiently promoted. If the temperature of nitriding exceeds 570° C., the temperature draws near to the eutectic point of Al—Si, which is 578° C., resulting in softening or deformation of the alloy and in an enlargement of the texture. Therefore, in order to sufficiently promote nitriding while suppressing an enlargement of the texture, the temperature for nitriding must be at least 530° C. and at most 570° C. if nitriding assistants are not added.

When the temperature for nitriding is set in the range of 530° C. to 570° C. as mentioned above, the time for nitriding must be at least 2 hours to at most 20 hours. More specifically, when nitriding is performed at 530° C. and the time for nitriding is shorter than 2 hours, the nitrogenous Al—Si powder metallurgical alloy containing 4 wt % of nitrogen cannot be obtained. If the temperature of nitriding is 570° C. and the time for nitriding exceeds 20 hours, the nitrogenous Al—Si powder metallurgical alloy containing at most 15 wt % of nitrogen cannot be obtained.

It should be noted that the desired content of nitrogen (4 wt % to 15 wt %) can be obtained by performing the nitriding for more than 20 hours at the temperature of 530° C. Similarly, the desired content of nitrogen can be obtained by nitriding for less than 2 hours at the temperature of 570° C. By appropriately controlling the temperature and time of nitriding, a nitrogenous Al—Si powder metallurgical alloy having the desired properties can be obtained.

The inventors have also found that the nitrogenous Al—Si powder metallurgical alloy having the above described properties can be manufactured by sintering in an atmosphere containing nitrogen at a relatively low temperature for a shorter period of time. For reducing the nitriding time, a molded body of Al—Si alloyed powder is sintered in an atmosphere containing nitrogen. The starting powder, to which a desired amount of a nitriding assistant has been added, has been caused to rapidly solidify.

If a nitriding assistant element is added, the present method includes the following steps.

First, a molten Al alloy containing Si and at least one element selected from the group consisting of Li, Mg, Ti, V, Cr, Mn, Fe, Co, Ni, Cu, Zn, Zr, Nb, Mo and W is rapidly solidified to form a rapidly solidified Al—Si alloyed powder. Next, the rapidly solidified Al—Si alloyed powder including the assistant is subjected to compression molding, to form a molded body. Next, the obtained body is sintered in an atmosphere containing nitrogen, at a temperature within the range of from 475° C. to 570° C. for 2 to 8 hours.

Where a nitriding assistant is added, the sintering of the molded body, is preferably performed in a temperature range from 475° C. to 570° C. for at least 2 hours and at most 20 hours.

Further, the molten Al alloy should preferably be prepared to contain at most 10 wt % of at least one nitriding assistant element selected from the group consisting of Li, Ng, Ti, V, Cr, Mn, Fe, Co, Ni, Cu, Zn, Zr, Nb, Mo and W.

In the step of manufacturing the nitrogenous Al—Si powder metallurgical alloy, the temperature and time of nitriding are very important. If a nitriding assistant element is added, the nitriding temperature can be selected at the lower end of the above range. However, if the nitriding temperature at which also the sintering takes place, is lower than 475° C., the reaction rate between the Al—Si alloyed powder and nitrogen in the atmosphere is not sufficient, and the nitriding phenomenon does not proceed sufficiently.

By contrast, if the nitriding temperature exceeds 570° C., it becomes close to the eutectic point of Al—Si, which is 578° C., resulting in softening, deformation of the alloy body and in an enlarged texture. Therefore, in order to sufficiently promote nitriding while suppressing a texture enlargement (grain size), the nitriding temperature must be at least 475° C. and at most 570° C.

The temperature for starting the nitriding and the time duration of the nitriding dependent on the composition of the alloy, namely whether any of the above listed assistant elements have been added to the starting material.

If the nitriding temperature is set to be at least 475° C. and at most 570° C., the time for nitriding must be at least 2 hours and at most 8 hours with an assistant element and up to 20 hours without such addition. If the nitriding is to be performed at 475° C. and the time for nitriding is shorter than 2 hours, a nitrogenous Al—Si powder metallurgical alloy containing at least 4 wt % of nitrogen cannot be obtained. If the nitriding temperature is 570° C. and the time for nitriding exceeds 8 hours, a nitrogenous Al—Si powder metallurgical alloy containing at most 15 wt % of nitrogen cannot be obtained; more specifically, the upper nitrogen limit permitted by the invention would be exceeded. However, the desired nitrogen content can be obtained by nitriding for more than 8 hours at the lower temperature of 475° C. Similarly, the desired nitrogen content can be attained by less than 2 hours at 570° C. However, if the nitriding continues for more than 20 hours at 475° C., the prescribed nitrogen content cannot be obtained. In this manner, by appropriately controlling the time and temperature of nitriding, the nitrogenous Al—Si powder metallurgical alloy having desired properties can be obtained.

The molten Al alloy should preferably be prepared to contain at least 10 wt % and at most 50 wt % of Si.

The step of preparing rapidly solidified Al—Si alloyed powder should preferably include the step of solidifying molten Al alloy at the solidifying rate of at least $10^{2°}$ C./sec.

Al itself is disadvantageous for the above mentioned purposes in that it has an extremely high coefficient of thermal expansion of $23.5 \times 10^{-6}$/°C. On the other hand, Al has a density as small as 2.7 g/cm$^3$ and a superior coefficient of thermal conductivity of 0.5 cal/cm·sec·°C. Thus, Al is preferable in view of its low density and its high thermal conductivity. However, the thermal conductivity aluminum is much degraded by solid solution or precipitation when aluminum is alloyed with another metal element.

Si has coefficient of thermal conductivity of at least 0.3 cal/cm·sec·°C., and the degree of solid solution in an Al—Si alloy is relatively small. Therefore, when Si is added to Al, Si crystallizes or is precipitated in an Al matrix as Si crystals, and therefore even when the content of Si increases, the coefficient of thermal conductivity of the Al—Si alloy is relatively small. Further, Si has a thermal expansion coefficient of $4.2 \times 10^{-6}$/°C., and therefore when it is added to Al, it provides a lower coefficient of thermal expansion approximately in accordance with the rule of mixture.

As described above, Si is an element effective in reducing the coefficient of thermal expansion. However, when Si is added to the melt for forming the Al—Si alloy, in an amount less than 10 wt %, the effect of Si is too small to provide the desired reduction in the thermal expansion coefficient. If Si is added to the melt in an amount larger than 50 wt %, atomizing becomes difficult because of the solution or solidification of Si. Therefore, the desired amount of Si to be contained in the melt for the Al—Si alloy is from 10 wt % to 50 wt %, whereby the content of Si in the nitrogenous Al—Si powder metallurgical alloy after nitriding corresponds approximately, to 8.5 wt % to 48 wt %.

The size of the Si crystal crystallized or precipitated in the Al matrix largely depends on the rate of solidification. If this rate of solidification is less than $10^{2°}$ C./sec, the crystallized Si crystal becomes too large, lowering the moldability and cuttability. Therefore, the rate of solidification should preferably be at least $10^{2°}$ C./sec.

The rate of solidification if air is used for atomizing is about $10^{3°}$ C./sec. The rate of solidification for various other atomizing methods is at least $10^{2°}$ C./sec. When the rate of solidification is set to be $10^{3°}$ C./sec, the grain size of the primary Si crystal would be 40 µm at the largest.

The step of compression molding should desirably be performed so that the relative density of the molded body is set to be at least 50% and at most 90% of the possible density.

In the control of nitriding, management of the density of the molded body is of critical importance. In order to allow a homogenous nitriding reaction in the molded body with nitrogen in the atmosphere, the gas permeability of the molded body is important. In order to ensure a sufficient air permeability, the relative density of the molded body should necessarily be at most 90%. If the relative density is lower than 50%, the strength of the molded body is too low. Therefore, the relative density should desirably be at least 50% and at most 90%.

If the molding pressure exceeds 6 t/cm$^2$, the surface layer portion of the molded body becomes too dense thereby degrading the air permeability. Therefore, in order to obtain the aforementioned relative density of the molded body, the molding pressure should not be higher than 6 t/cm$^2$.

Preferably, the sintering step includes sintering the molded body at a normal pressure atmosphere with a nitrogen partial pressure of at least 0.95 atm. The normal pressure refers to the normal pressure applied by the gas atmosphere to the molded body during sintering, which is not increased or reduced by the ambient pressure.

Preferably, the normal pressure atmosphere has a partial steam pressure of at most 0.01 atm.

In order to generate nitride on the surface of the powder crystals during nitriding so as to promote the nitriding phenomenon, it is necessary to provide an atmosphere mainly consisting of nitrogen gas. For this purpose, it is preferred that the nitrogen partial pressure is at least 0.95 atm.

Sintering can be promoted to some extent if the atmosphere pressure is increased. However, in view of cost efficiency and necessary equipment considerations, the normal pressure is sufficient.

If the steam partial pressure in the atmosphere is too high, oxidation of Al component on the surface of the powder crystals occurs, hindering the nitriding. Further, steam serves to decompose the nitride formed on the surface of the powder crystals. Therefore, it is necessary to reduce the partial steam pressure. Such partial steam pressure reduction also assists the evaporation and decomposition of water absorbed in the powder while the temperature is increased to the sintering temperature. Therefore, it is desirable to keep the partial steam pressure at 0.01 atm at most.

Preferably, the rapidly solidified Al—Si alloyed powder should have a maximum grain diameter of 74 μm, an average grain diameter of at most 67 μm, and a specific surface area of at least 0.2 m$^2$/g. This means that each powder, namely the aluminum powder and the silicon powder, must satisfy these maximum and average grain sizes.

When powder is to be prepared by atomizing, the rate of solidification differs depending on the grain size of the powder. Further, the frequency of metal contact between the powder crystals and the size of the surface area reacting with nitrogen are much influenced by the grain size of the powder. If the maximum grain diameter of the raw material powder exceeds 74 μm, the average grain diameter exceeds 67 μm or the specific surface area becomes smaller than 0.2 m$^2$/g, nitriding reaction becomes slower, and the distribution of nitride becomes uneven. Therefore, it is desirable to prepare a raw material powder having a maximum grain diameter of 74 μm, average grain diameter of at most 67 μm and specific surface area of at least 0.2 m$^2$/g. Here, the specific surface refers to the surface area per unit weight.

Preferably, the manufacturing method further includes the step of heating the sintered body obtained through the step of sintering to at least 400° C. and molding and consolidating the sintered body. A forging die heated to a temperature of at least 150° C. is used for the molding and consolidation under a forging pressure of at least 4 t/cm$^2$ so that the relative density becomes at least 98% of the possible density, thus providing a forged body.

The nitrided sintered body has pores inside, and therefore it has a low thermal conductivity and air tightness. If a higher air tightness and strength are required with an increased thermal conductivity, the sintered body may be formed by forging. If the relative density of the body obtained by forging exceeds 98% of the possible density, the thermal conductivity and air tightness are much improved. In order to attain such a high relative density, it is desired to soften the sintered body by heating the same to 400° C. or more, and consolidating the same under the forging pressure of at least 4 t/cm$^2$. At this time, if the temperature of the die is lower than 150° C., the surface layer of the sintered body cannot be made dense. Therefore, the die should preferably be heated to 150° C. or more.

The nitrided sintered body has internal pores. Therefore, the surface roughness and dimensional precision can be much improved by sizing or coining. The correcting pressure providing such effects is at least 4 t/cm$^2$.

The sintered body obtained by the above described steps can be actually used as it is or after further machining. A material such as AlN containing ceramics is often difficult to machine. However, in the nitrogenous Al—Si powder metallurgical alloy in accordance with the present invention, AlN is produced by reaction and it has very fine particles. Therefore, it allows cutting as well as threading.

A desired shape can be obtained by hot extrusion of the nitrided molded body.

After the aforementioned further machining, surface treatment may also be performed as needed. For example, if it is to be used as a semiconductor substrate or as a package, a surface layer of metal such as Au or Ni or a surface layer of an insulator such as $Al_2O_3$, AlN or $SiO_2$ may be formed to improve the wettability with solder or glass, or to ensure insulation. Since the nitrogenous Al—Si powder metallurgical alloy of the present invention is based on Al, a surface layer of $Al_2O_3$ can be naturally and readily formed by anodic oxidation, and a surface layer of AlN can be naturally and readily formed by nitriding, whereby such layers can be produced to have a sufficient thickness.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
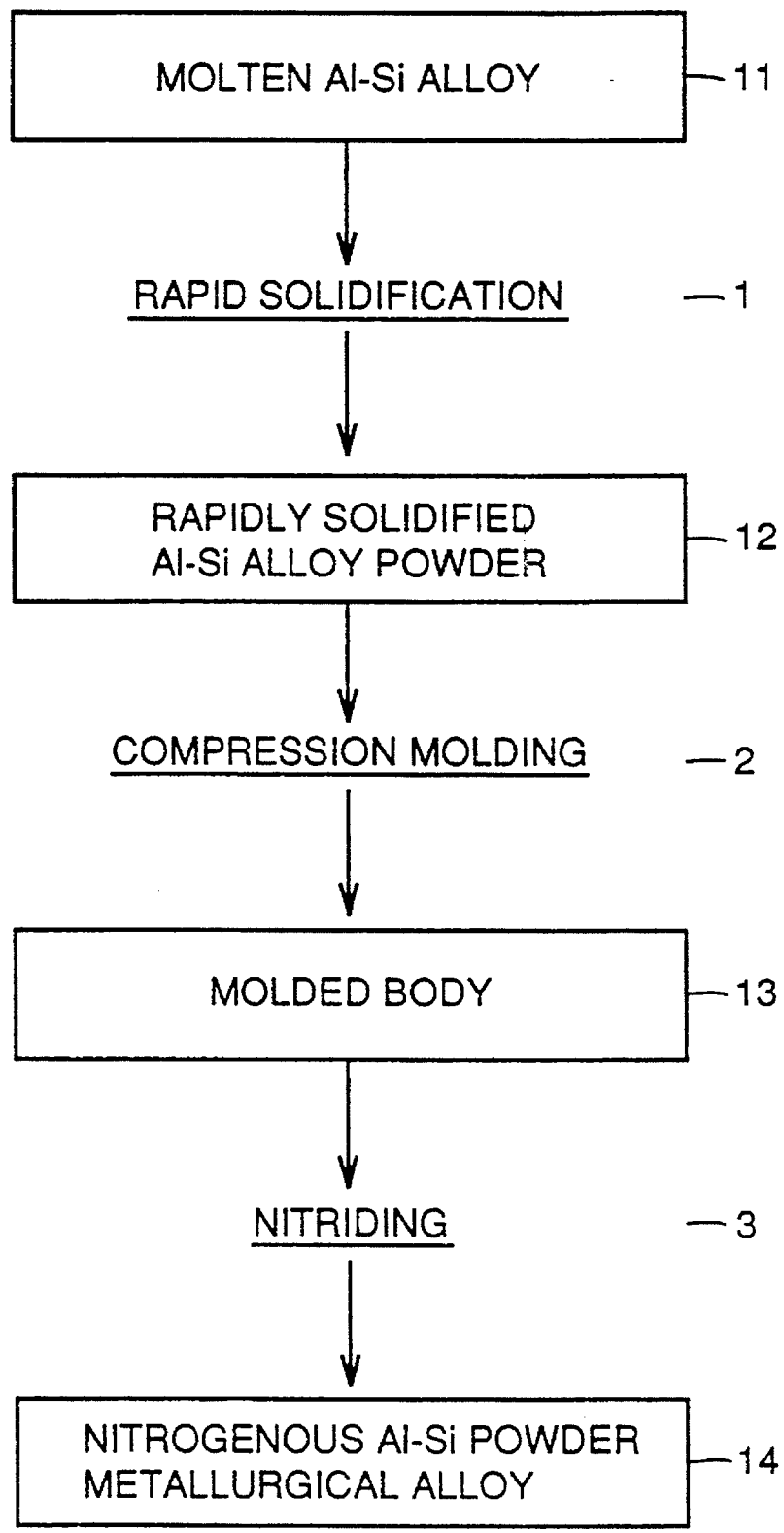
FIG. 1 is a block diagram showing steps of manufacturing in accordance with a first Embodiment of the present invention.

Referring to FIG. 1, molten Al—Si alloy 11 containing 41 wt % of Si was rapidly solidified (step 1) at the solidifying rate of $10^{3°}$ C./sec in accordance with the air atomizing method to produce a raw material powder. The produced atomized powder 12 of rapidly solidified Al—Si alloy was sifted to 149-105 μm (119 μm), 105-74 μm (88 μm), 74-63 μm (67 μm), 63-44 μm (52 μm) and smaller than 44 μm (31 μm), where the values in the parentheses denote average grain size.

An acetone solution of myristic acid was applied to the dies, and respective powders 12 were molded into tablet specimens (molded bodies 13) of φ20×30 mm with relative densities of 65%, 78%, 85% and 94% of the possible density under molding pressure in the range of 2 to 10 t/cm² (step 2). The molded bodies 13 were subjected to nitriding for 10 hours at 560° C. in a normal pressure atmosphere, in which the nitrogen partial pressure was at least 0.99 atm and the steam partial pressure was at most 0.005 atm (step 3). The influence of the grain size and the density after molding on the nitrogen content in the nitrided body is as shown in FIG. 2.

Here, the molded body having a relative density of less than 50% of the possible density could not retain its shape, as it was chipped off when taken out from the dies.

Figure 2:
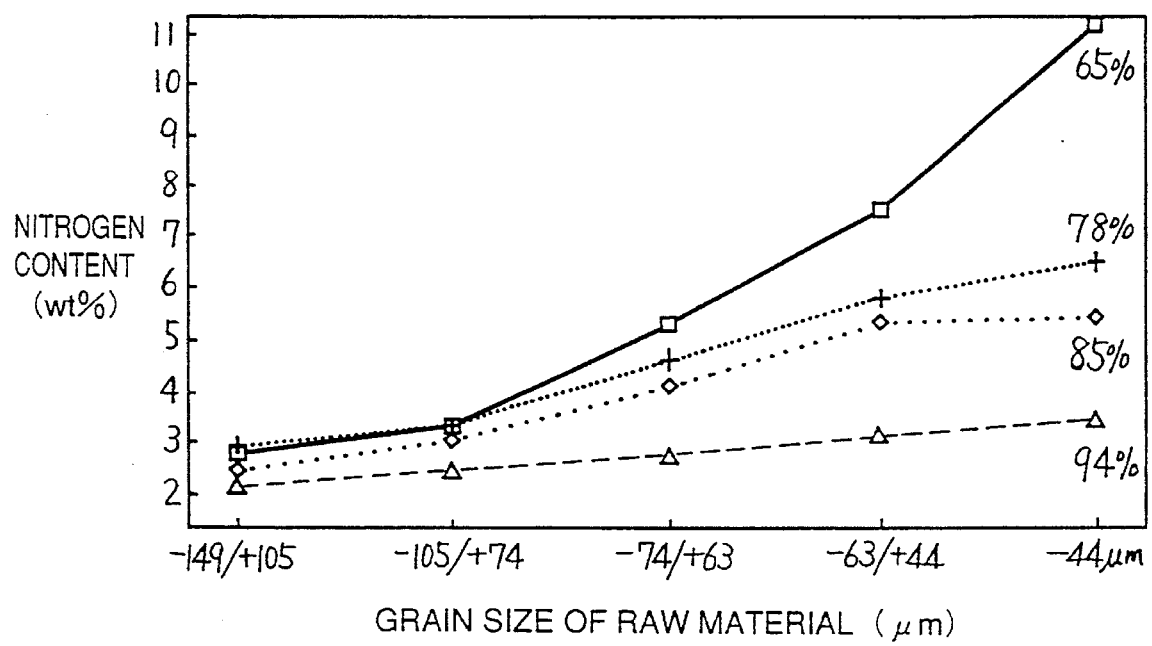
FIG. 2 is a graph showing the influence of the grain size and density after molding on the amount of nitrogen in the nitrided body obtained according to the first Embodiment of the present invention.

As is apparent from the results shown in FIG. 2, if the maximum grain size exceeds 74 μm (average grain diameter of 67 μm), the nitrogen content become smaller than 4 wt % at every relative density.

When the true relative ratio 90%, the nitrogen content does not reach 4 wt % even when the grain size of the atomized powder crystals is reduced.

Here, the sign − denotes the maximum grain diameter and + denotes the minimum grain diameter.

Figure 3A:
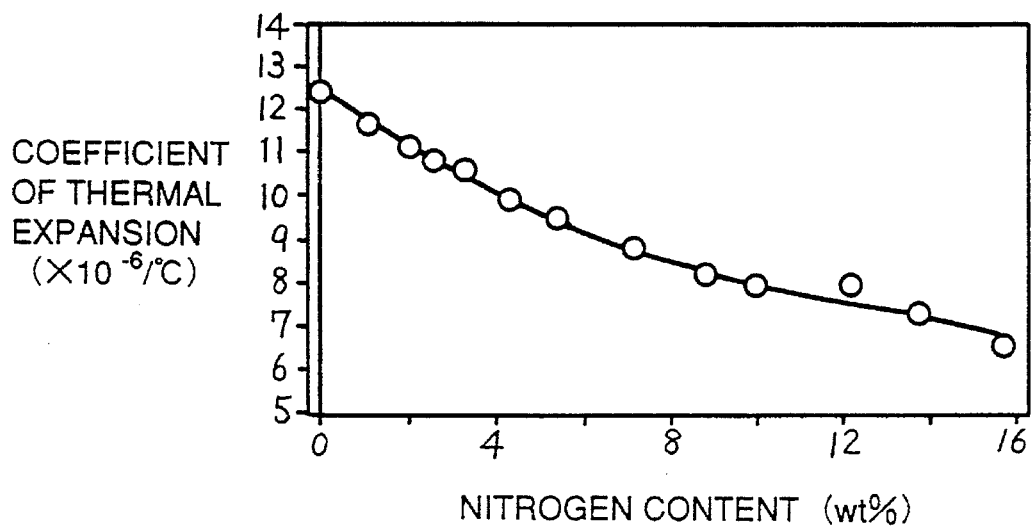
FIGS. 3A, 3B and 3C are graphs showing the influence of the nitrogen content on the coefficient of thermal expansion, the coefficient of thermal conductivity and the density of the forged body obtained according to the first Embodiment of the present invention.
Figure 3B:
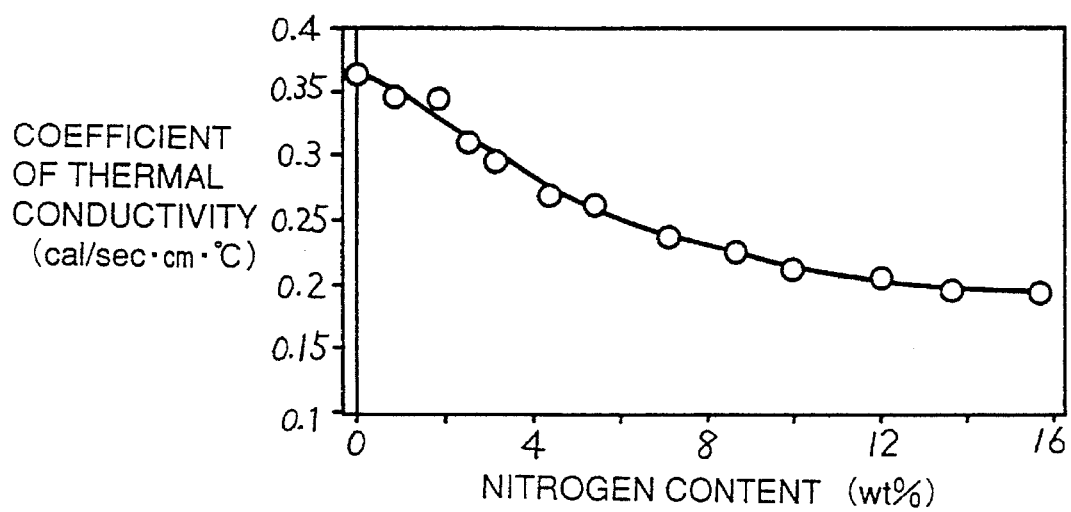
Figure 3C:
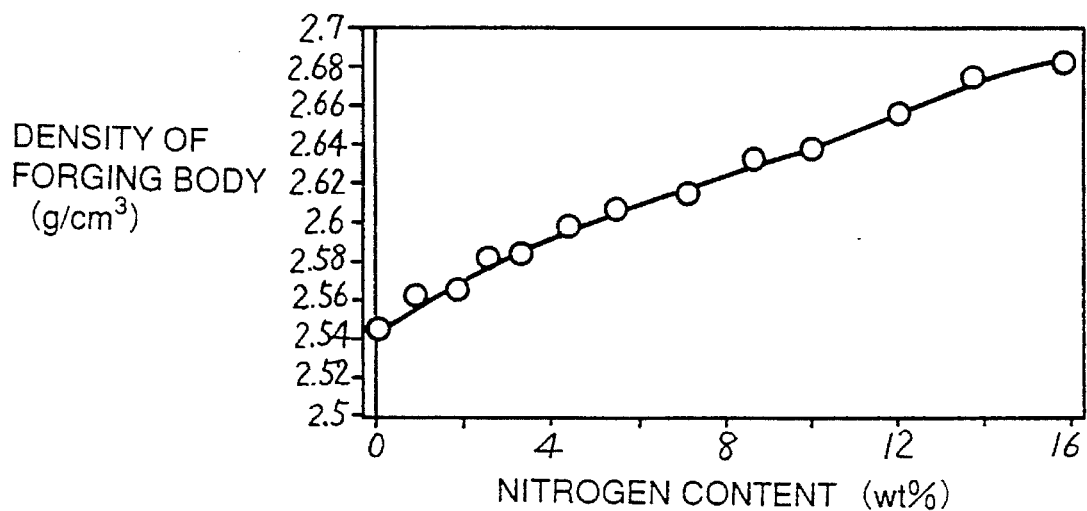

Then, powder having a maximum grain diameter of 44 μm and an average grain diameter of 31 μm was subjected to compression molding under a molding pressure of 2 t/cm³ to produce molded bodies having a relative density of 65% of the possible density. The molded body was nitrided for respective time periods within a range of 0 to 22 hours at the temperature of 560° C. in a normal pressure atmosphere in which the nitrogen partial pressure was at least 0.99 atm and the steam partial pressure was at most 0.05 atm. Zero hours means that some molded bodies were not nitrided. The nitrided bodies and molded bodies without nitriding were heated to 500° C., and then inserted into a forging die having a diameter of 22 mm and a die temperature of 350° C. Thereafter, the nitrided bodies and molded bodies without nitriding were consolidated with a pressure of 6 t/cm² by using forged dies, thus fabricating forging bodies having relative densities of 98 to 100% of the possible density. FIGS. 3A, 3B and 3C show the relations between the nitrogen content and various properties (density, thermal conductivity and coefficient of thermal expansion) of the forged bodies.

The coefficient of thermal expansion was measured by the push rod method. The temperature, on average, increased from 20° C. to 200° C. for measuring the expansion coefficient. The coefficient of thermal conductivity was measured in accordance with the laser flash method, and the density was measured in accordance with the Archimedes methods.

Referring to FIG. 3A, if the nitrogen content is smaller than 4 wt %, the coefficient of thermal expansion exceeds $10×10^{-6}$/°C.

Referring to FIG. 3B, if the nitrogen content exceeds 15 wt %, the coefficient of thermal conductivity becomes smaller than 0.2 cal/cm·sec·°C.

Referring to FIG. 3C, the density of the forged body was below 3.0 g/cm³ at any nitrogen content measured.

As is apparent from FIGS. 3A, 3B and 3C, the target property values can be attained when the nitrogen content is at least 4 wt % and at most 15 wt %.

From the result of X-ray analysis, it was found that no less than 90 wt % of nitrogen contained in the forged body was AlN.

Embodiment 2

Figure 4:
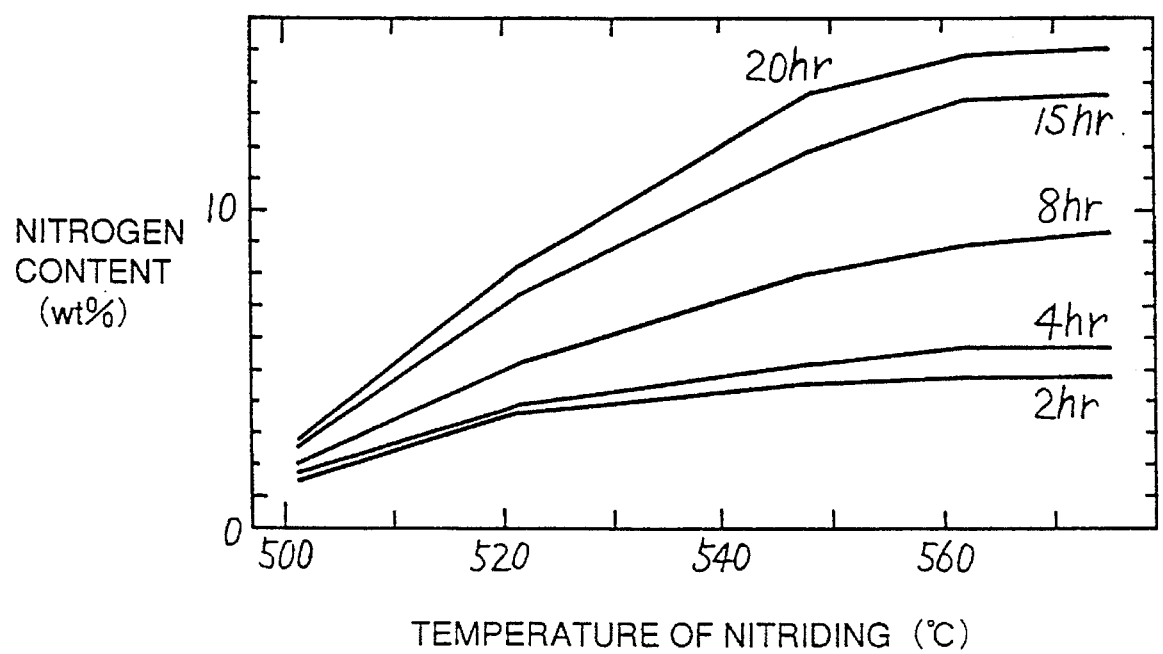
FIG. 4 is a graph showing the influence of the temperature and processing time on the nitrogen content in the nitrided body obtained according to the second Embodiment of the present invention.

The powder prepared in Embodiment 1 was sifted so as to have the maximum grain diameter of at most 74 μm, and Al-41 wt % Si alloy powder having average grain diameter of 32 μm was obtained. The powder was subjected to compression molding with the pressure of 2 t/cm$^2$, and thus molded bodies having a relative density of 66% of the possible density and a dimension of 10×10×15 mm were prepared. In a normal pressure atmosphere with a nitrogen partial pressure of at least 0.99 atm and a steam partial pressure of at most 0.005 atm, the molded bodies were subjected to nitriding for 2 to 20 hours at 480° C., 501° C., 521° C., 548° C., 562° C. and 575° C. FIG. 4 shows the influence of the temperature and time of processing on the amount of nitrogen in the nitrided bodies.

Referring to FIG. 4, when nitriding is performed for 2 hours at a temperature lower than 530° C., the nitrogen content in the nitrided body becomes smaller than 4 wt %. If nitriding is performed for more than 20 hours at 570° C., the nitrogen content of the nitrided body exceeds 15 wt %. If the temperature of nitriding exceeds 570° C., the molded body becomes soft and deformed during nitriding. From the experimental results, it was found that the temperature for nitriding must be in the range of from 530° C. to 570° C. and the time for nitriding must be at least 2 hours and at most 20 hours, in order to attain the desired nitrogen content in the nitrided body.

In the above described experiment, the nitrided body which was subjected to nitriding for 8 hours at a temperature of 548° C. was thereafter heated to 500° C. and inserted into a forging die of 11×16 mm which had been heated to 350° C. Thereafter, the nitrided body was consolidated under a pressure of 6 t/cm$^2$ by using a forging die, whereby a forged body having the relative density of 100% was fabricated. The density of the forged body was 2.62 g/cm$^3$, the coefficient of thermal conductivity was 0.24 cal/cm·sec·°C., and the coefficient of thermal expansion was 8.7×10$^{-6}$/°C.

For comparing a molded body prepared as described above was nitrided for 8 hours at 540° C. in a normal pressure atmosphere at a different nitrogen partial pressure of 0.90 atm and a different steam partial pressure of 0.05 atm. However, in that case, generation of a nitride was not observed.

Embodiment 3

Molten Al—Si alloy containing 8 wt %, 11 wt %, 25 wt %, 38 wt %, 45 wt % and 54 wt % of Si, respectively, were powdered by the air atomization method. The resulting powder was sifted so as to have the maximum grain diameter of at most 74 μm. Thus Al-8 wt % Si, Al-11 wt % Si, Al-25 wt % Si, Al-38 wt % Si and Al-45 wt % Si having average grain diameter of 32 μm, were prepared.

Here, the molten alloy of Al-54 wt % Si caused nozzle choking during air atomization, thus atomization was impossible. An acetone solution of myristic acid was applied to the dies, the respective powders were subjected to compression molding with the molding pressure of 2 to 2.5 t/cm$^2$, and tablet specimens of a diameter of 20×30 mm with a relative density of about 70% of the possible density were fabricated. The molded bodies were nitrided for 15 hours at 540° C. in a normal pressure atmosphere, with a nitrogen partial pressure of at least 0.99 atm and a steam partial pressure of at most 0.005 atm. The nitrided bodies obtained in this manner were heated to 500° C., and inserted into forging dies having a diameter of 22 mm which had been heated to 350° C., as in Embodiment 1. Thereafter, the nitrided bodies were consolidated with a pressure of 6 t/cm$^2$ by using the forging dies, whereby forged bodies having relative densities of 98 to 100% were fabricated. The density, the coefficient of thermal expansion and the coefficient of thermal conductivity of the forged bodies were as shown in the Table 1 below.

TABLE 1

| | Si Content in Powder (wt %) | 8 | 11 | 25 | 38 | 45 |
|---|---|---|---|---|---|---|
| Properties of Nitrided Bodies | Nitrogen Content (wt %) | 11.8 | 12.2 | 12.5 | 11.2 | 10.3 |
| | Si Content (wt %) | 7.1 | 9.7 | 21.9 | 33.7 | 40.4 |
| | Density (g/cm$^3$) | 2.84 | 2.83 | 2.76 | 2.67 | 2.62 |
| | Coefficient of Thermal Expansion (× 10$^{-6}$/°C.) | 10.4 | 9.9 | 8.6 | 8.0 | 7.7 |
| | Coefficient of Thermal Conductivity (cal/cm · sec · °C.) | 0.38 | 0.33 | 0.23 | 0.21 | 0.20 |

Figure 5:
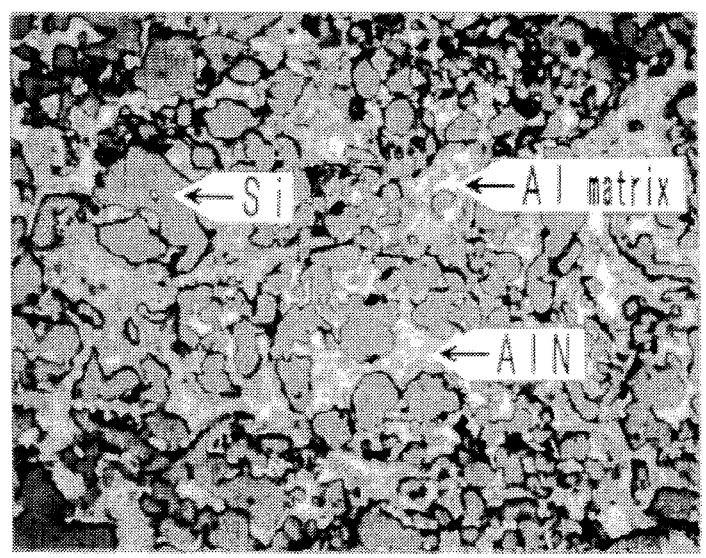
FIG. 5 is a microphotograph of a texture of the nitrided body including Al and 38 wt % of Si obtained according to the third Embodiment of the present invention.
Figure 6:
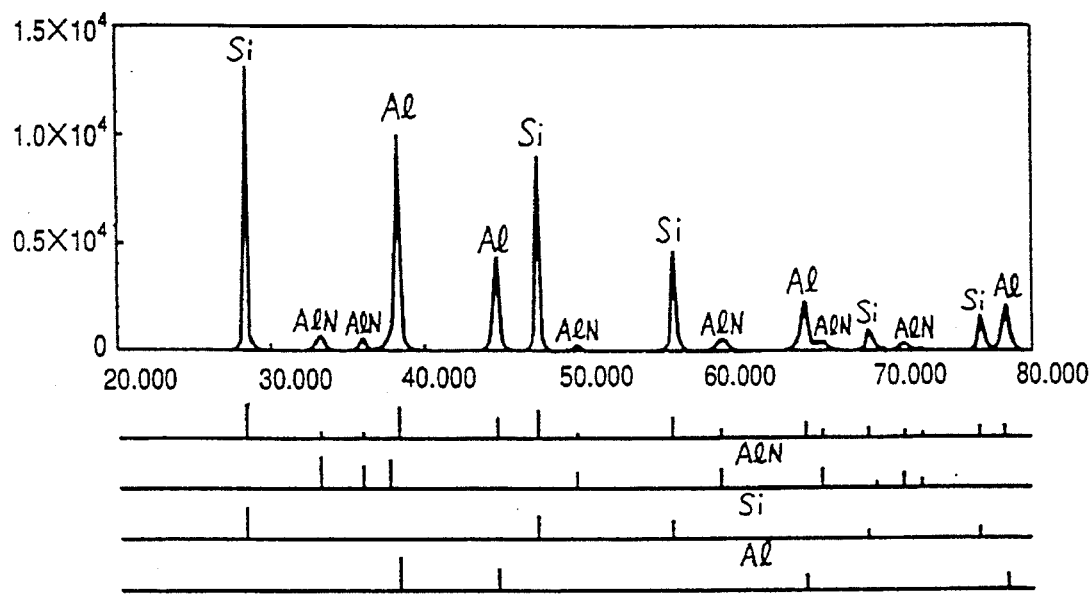
FIG. 6 is an X-ray analysis image of the nitrided powder molded body containing Al and 38 wt % of Si obtained according to the third Embodiment of the present invention.

FIG. 5 is a microphotograph of the texture observed during forging of a powder molded body containing Al and 38 wt % of Si. In the photograph of FIG. 5, the relatively dark (black) portion corresponds to Si, the white portion corresponds to the Al matrix, and the relatively bright (gray) portion corresponds to AlN. FIG. 6 is an X-ray analysis image of the nitrided body.

From the results shown in the table, it can be understood that the coefficient of thermal expansion of the nitrided body fabricated by using Al-8 wt % Si powder exceeds 10×10$^{-6}$/°C. Molten Al-54 wt % Si could not be atomized. Therefore, it is understood that in order to obtain nitrided body having the desired nitrogen content, molten Al alloy must contain at least 10 wt % and at most 50 wt % of Si.

Embodiment 4

Molten Al—Si alloy containing 45 wt % of Si was powdered by the air atomizing method. The powder was sifted so that it had a maximum grain diameter of at most 74 μm and an average grain diameter of 32 μm.

An acetone solution of myristic acid was applied to the die, the powder was subjected to compression molding at the pressure of 2.5 t/cm$^2$ to form a tablet specimen having a diameter of 98 mm, a thickness of 50 mm, and a relative density of 70% of the possible density. The molded body was nitrided for 15 hours at a temperature, of 540° C. in a normal pressure atmosphere a nitrogen partial pressure of at least 0.99 atm, and a steam partial pressure of at most 0.005 atm. The nitrogen content of the resulting nitrided body was measured to be 10.5 wt %, and the nitrogen content of the AlN equivalent was 31 wt %.

For comparing 31 wt % of a commercially available AlN powder having an average grain diameter of 0.8 μm were added to Al-45 wt % Si having average grain diameter of 32 μm. Thereafter, an acetone solution of myristic acid was applied to the die, and the mixed powder was subjected to compression molding under a pressure of 2.5 t/cm$^2$, to produce a tablet specimen having a diameter of 98 mm, a thickness of 50 mm, and a relative density of about 70%.

The nitrided body and the molded body of the powder to which AlN powder was added were both heated to 500° C., and inserted into forging dies having a diameter of 100 mm and heated to a temperature of 350° C. Thereafter, the nitrided bodies were consolidated with at a pressure of 6 t/cm$^2$ by using the forging dies.

The density, the coefficients of thermal conductivity and the coefficients of thermal expansion of these forging bodies were as shown in the Table 2 below.

TABLE 2

|  | Nitrided Body | AlN Powder Added |
|---|---|---|
| Density (g/cm$^3$) | 2.62 | 2.55 |
| Coefficient of Thermal Expansion ($\times 10^{-6}$/°C.) | 7.7 | 7.9 |
| Coefficient of Thermal Conductivity (cal/cm · sec · °C.) | 0.20 | 0.17 |

It can be seen from the table above that the forged body with AlN powder added has an inferior hot moldability as compared with the nitrided body, since the density was reduced even though it has the same composition as the nitrided body. As a result, the forged body with AlN powder added had a lower coefficient of thermal conductivity than the nitrided body.

Further, cutting was performed on both specimens. The nitrided body could be cut until a desired shape was obtained. By contrast, the forged body to which AlN powder was added, was chipped because of a non-uniform distribution of AlN in the forged body, which made cutting difficult. From these results, it is understood that the forged body of the present invention is far superior in cuttability as compared with the forged body to which AlN powder was added. The reason for this may be the fact that AlN in the forged body of the present invention was produced by reaction rather than by adding an AlN powder to the starting material, so that particles are very fine and dispersed uniformly.

Further, respective forged bodies were cut into shapes 30×20×5 mm in size and heated for 10 minutes at 850° C. The forged body to which AlN powder was added expanded and cracked by the thermal processing, and it cannot retain the aforementioned shape. By contrast, the nitrided body was not deformed at all by this thermal processing. The reason for this may be that AlN generated by reaction coated the Al crystals in the nitrided body, so that heat resistance of the nitrided body of the invention was improved.

Embodiment 5

Referring to FIG. 1, molten Al—Si alloy 11 containing 41 wt % of Si and 1 wt % of Mg was rapidly solidified (step 1) at the solidification rate of $10^{3°}$ C./sec by an air atomization method for producing an alloy powder 12 which was sifted to provide powders having the following grain sizes: 149-105 μm (119 μm), 105-74 μm (88 μm), 74-63 μm (67 μm), 63-44 μm (52 μm), and 44 μm (31 μm) or smaller. The numbers in the parentheses represent the average grain diameter.

Figure 7:
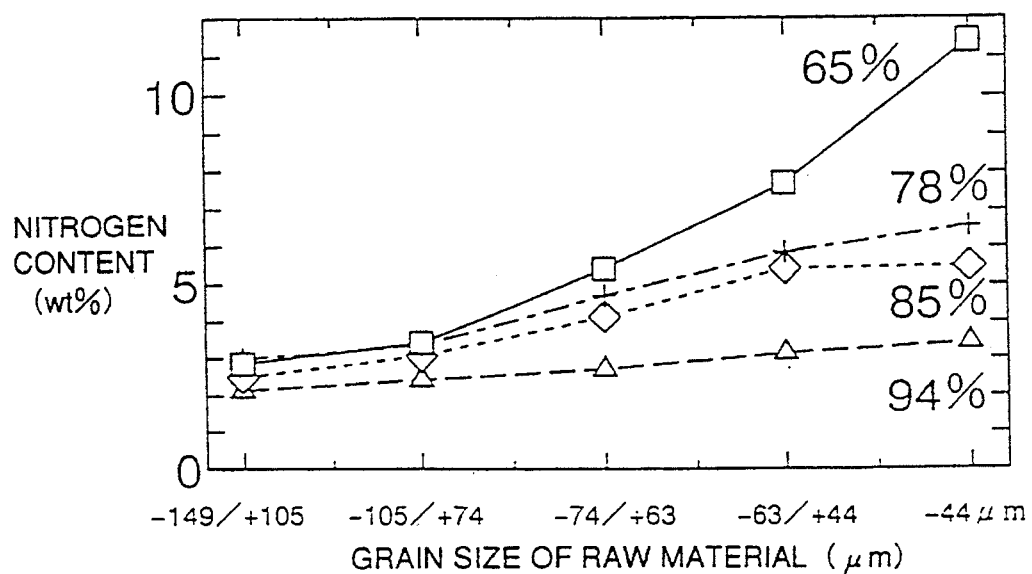
FIG. 7 is a graph showing the influence of the grain size and density after molding on nitrogen content of the nitrided body obtained according to the fifth Embodiment of the present invention.

An acetone solution of myristic acid was applied to the dies, and atomized powders 12 were molded to form tablet specimens (molded bodies 13) having a diameter of 20 mm, a thickness of 30 mm, and relative densities of 65%, 78%, 85% and 94% obtained by molding pressures in the range from 2 to 10 t/cm$^2$ (step 2). The molded bodies 13 were nitrided for 5 hours at 560° C. in a normal pressure atmosphere wherein the nitrogen partial pressure was at least 0.99 atm and the steam partial pressure was at most 0.005 atm (step 3). FIG. 7 shows the influence of the grain size and relative density after molding on the nitrogen content in the nitrided body.

As is apparent from the results shown in FIG. 7, when the maximum grain diameter exceeds 74 μm (average grain diameter of 67 μm), the nitrogen content becomes smaller than 4 wt % at every relative density.

If the relative density exceeds 90%, the content of nitrogen cannot reach 4 wt % even when the grain diameter of the atomized powder is reduced.

The molded body having a relative density of 50% or smaller could not retain its shape as it was chipped when taken out from the dies.

In FIG. 7, the sign − represents the maximum grain diameter and + represents the minimum grain diameter.

The aforementioned powder having a maximum grain diameter of 44 μm and average grain diameter of 31 μm was subjected to compression molding and an a pressure of 2 t/cm$^2$ to obtain molded bodies having a relative density of 65%, at thus molded bodies were obtained. The molded bodies were nitrided for respective time periods within a range of 0 to 9 hours at 560° C. in a normal pressure atmosphere with a nitrogen partial pressure of at least 0.99 atm and a steam partial pressure of at most 0.005 atm, so as to vary the nitrogen content. Zero hours means that some molded bodies were not nitrided. The resulting nitrided bodies and molded bodies without nitriding were heated to 500° C. and inserted into forging dies having a diameter of 22 mm and a temperature of 350° C. Then, the nitrided bodies and molded bodies without nitriding were consolidated with a pressure of 6 t/cm$^2$ by using the forging dies whereby forged bodies having relative densities of from 98 to 100% were fabricated. The relation between the nitrogen content and the coefficient of thermal expansion, the coefficient of thermal conductivity and the density of the forged bodies are shown in FIGS. 8, 9 and 10.

The coefficient of thermal expansion was measured in accordance with the push rod method while heating the samples to average of 20° C. to 200° C. The coefficient temperatures from thermal conductivity was measured in accordance with the laser flash method, and the density was measured in accordance with the Archimedes methods.

Figure 8:
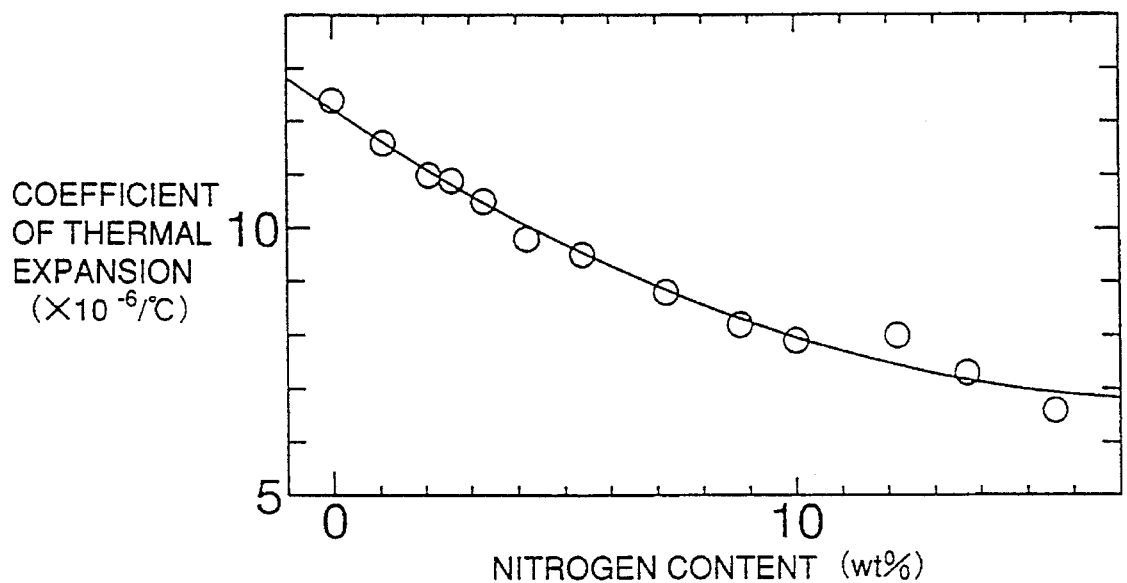
FIG. 8 is a graph showing the influence of the nitrogen content on the thermal expansion coefficient of forged body obtained according to the fifth Embodiment of the present invention.

Referring to FIG. 8, when content of nitrogen is smaller than 4 wt %, the coefficient of thermal expansion exceeds $10 \times 10^{-6}$/°C.

Figure 9:
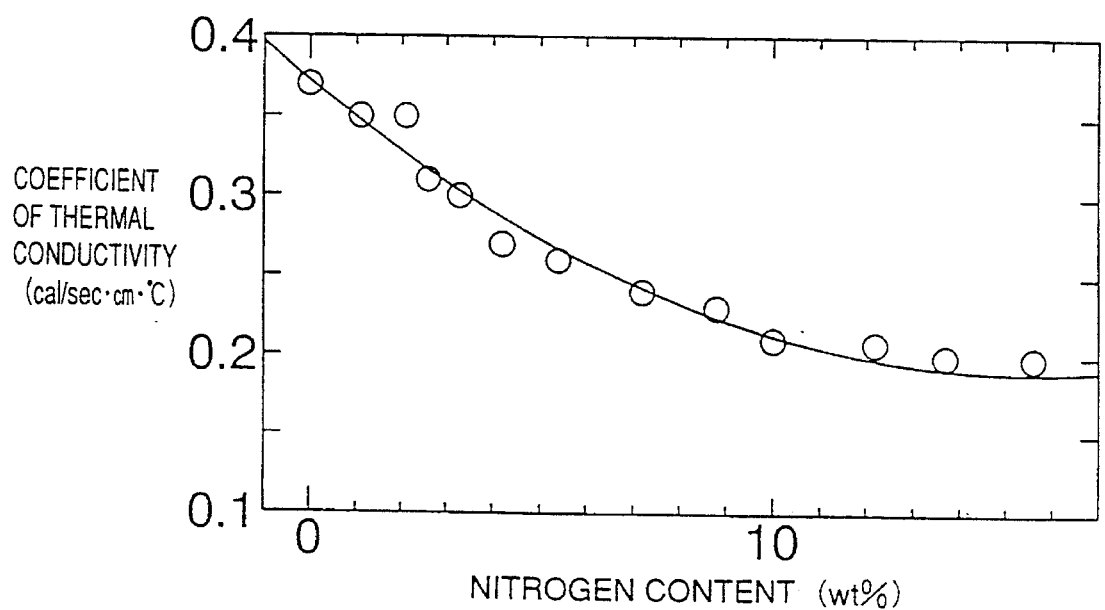
FIG. 9 is a graph showing the influence of the nitrogen content on the coefficient of thermal conductivity of the forged body obtained according to the fifth Embodiment of the present invention.
Figure 10:
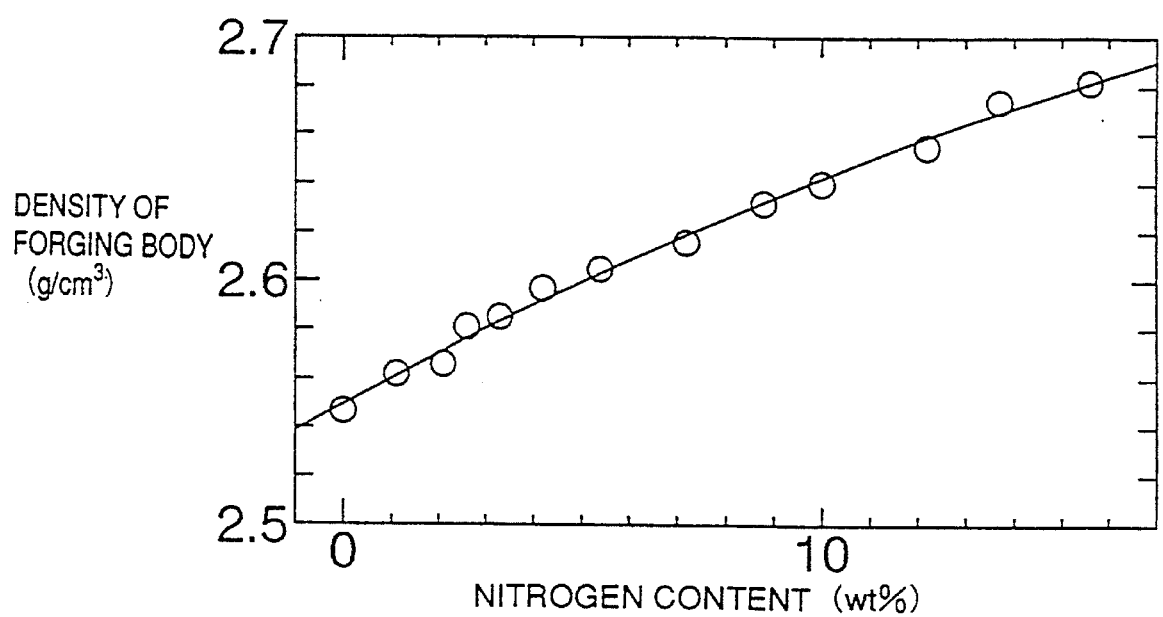
FIG. 10 is a graph showing the influence of the nitrogen content on the density of the forged body obtained according to the fifth Embodiment of the present invention.

Referring to FIG. 9, when the content of nitrogen exceeds 15 wt %, the coefficient of thermal conductivity becomes smaller than 0.2 cal/cm·sec·°C.

Referring to FIG. 10, the density of the forged bodies were less than 3.0 g/cm$^3$ at every measured nitrogen content.

As is apparent from FIGS. 8, 9 and 10, the target property values can be attained when the nitrogen content is at least 4 wt % and at most 15 wt %.

From the result of X-ray analysis, it was found that at least 90 wt % of nitrogen contained in the forged bodies was AlN.

The molded bodies were nitrided for 8 hours at 540° C. in a normal pressure atmosphere with a nitrogen partial pressure of 0.90 atm and a steam partial pressure of at least 0.05 atm. In this comparative example, generation of a nitrogenous substance was not observed.

Embodiment 6

Molten Al—Si alloy containing 8 wt %, 11 wt %, 25 wt %, 38 wt %, 45 wt % and 54 wt % of Si and 1 wt % of Mg was powdered by the air atomizing method. The powder was sifted so as to have the maximum grain diameter of at most 74 μm. Thus Al-8 wt % Si-1 wt % Mg, Al-11 wt % Si-1 wt % Mg, Al-25 wt % Si-1 wt % Mg, Al-38 wt % Si-1 wt % Mg and Al-45 wt % Si-1 wt % Mg, each having an average grain diameter of 32 μm were prepared.

The molten alloy of Al-54 wt % Si-1 wt % Mg could not be atomized as it caused nozzle clogging during air atomization.

An acetone solution of myristic acid was applied to the dies, respective powders were subjected to compression molding under the pressure of from 2 to 2.5 t/cm$^2$, and tablet specimens having a diameter of 20 mm, a thickness of 30 mm, and a relative density of about 70% were fabricated. The molded bodies were nitrided for 8 hours at 540° C. in a normal pressure atmosphere with a nitrogen partial pressure of at least 0.99 atm and a steam partial pressure of 0.005 atm at most. The resulting nitrided bodies were heated to 500° C. and inserted into forging dies having a diameter of 22 mm. The dies were heated to 350° C. Thereafter, the nitrided bodies were consolidated with a pressure of 6 t/cm$^2$ using the forging dies whereby forging bodies having relative densities of from 98 to 100% were fabricated. Densities, coefficients of thermal expansion and coefficients of thermal conductivity were as shown in Table 3 below.

TABLE 3

| | Si Content in Powder (wt %) | 8 | 11 | 25 | 38 | 45 |
|---|---|---|---|---|---|---|
| Properties of Nitrided Bodies | Nitrogen Content (wt %) | 11.8 | 12.2 | 12.5 | 11.2 | 10.3 |
| | Si Content (wt %) | 7.1 | 9.7 | 21.9 | 33.7 | 40.4 |
| | Density (g/cm$^3$) | 2.84 | 2.83 | 2.76 | 2.67 | 2.62 |
| | Coefficient of Thermal Expansion ($\times 10^{-6}$/°C.) | 10.4 | 9.9 | 8.6 | 8.0 | 7.7 |
| | Coefficient of Thermal Conductivity (cal/cm · sec · °C.) | 0.38 | 0.33 | 0.23 | 0.21 | 0.20 |

Figure 11:
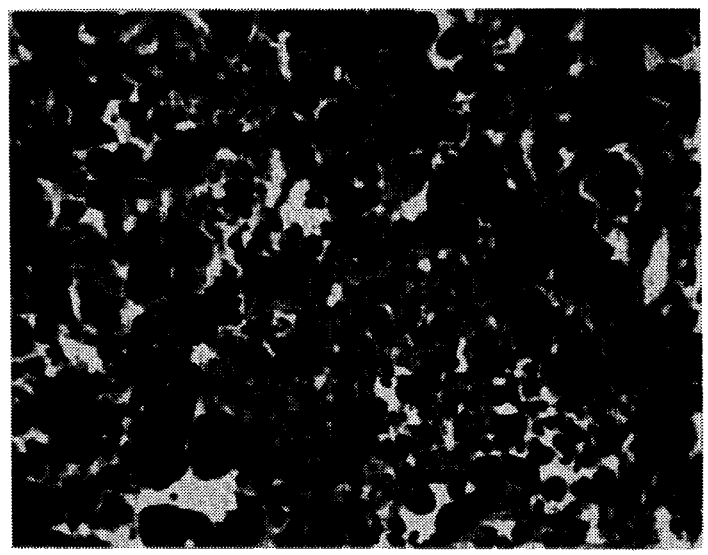
FIG. 11 is a microphotograph of a texture of the powder molded and forged body containing Al-38 wt % of Si and 1 wt % of Mg obtained according to the sixth Embodiment of the present invention.
Figure 12:
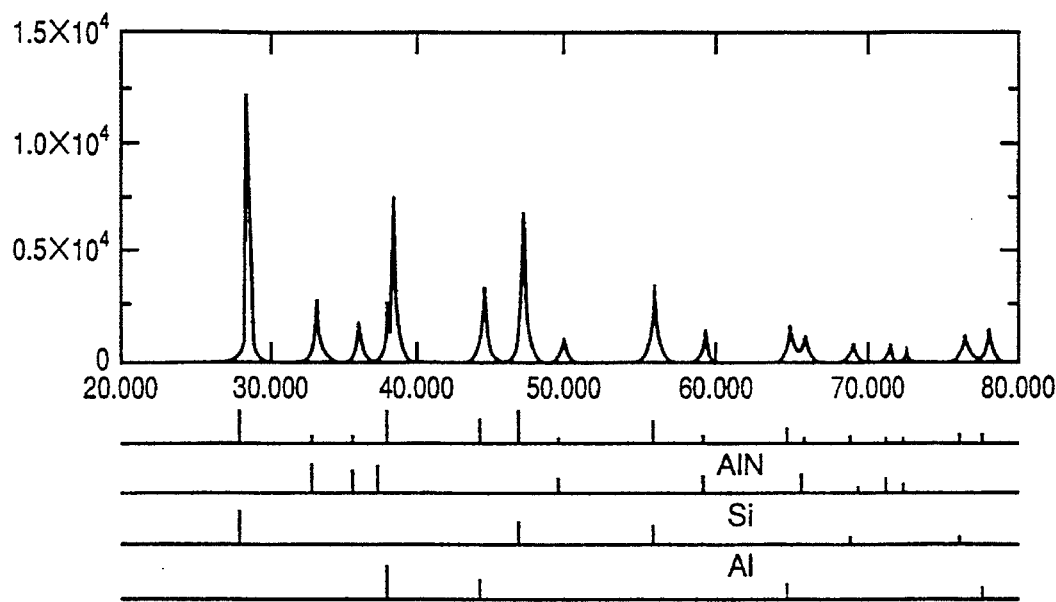
FIG. 12 is an X-ray analysis image of the powder molded forged body containing Al-38 wt % of Si and 1 wt % of Mg obtained according to the sixth Embodiment of the present invention.

A texture microphotograph observed in a molded and forged body of Al-38 wt % Si-1 wt % Mg is shown in FIG. 11. In the photograph of FIG. 11, the black portion corresponds to Si, the white portion corresponds to Al matrix and the gray portion corresponds to AlN. FIG. 12 is an X-ray analysis image of the forged body.

Embodiment 7

Molten Al—Si alloys, to which 33 wt % of Si was added, were mixed with elements shown in the table below. The mixed melt was powdered by the air atomizing method. The powders were sifted to have a maximum grain diameter of at most 74 μm.

An acetone solution of myristic acid was added to dies, and respective powders were subjected to compression molding with a pressure of from 2 to 2.5 t/cm$^2$ thereby forming tablet specimens having a diameter of 20 mm, a thickness of 30 mm, and a relative density of about 70%. The molded bodies were nitrided for 8 hours at 540° C. in a normal pressure atmosphere with a nitrogen partial pressure of at least 0.99 atm and a steam partial pressure of at most 0.005 atm. The resulting nitrided bodies were heated to 500° C., and then inserted into forging dies having a diameter of 22 mm and a temperature of 350° C. Thereafter, the nitrided bodies were consolidated with a pressure of 6 t/cm$^2$ using the forging dies, whereby forged bodies having relative densities of from 98 to 100% were fabricated. The densities, coefficients of thermal expansion and coefficients of thermal conductivity of the forged bodies were as shown in the Table 4 below.

TABLE 4

| Properties of Forging Bodies | Added Element (wt %) | — | Fe(11) | Ni(11) | Li(1) | Mg(1) | Ti(1) | V(1) |
|---|---|---|---|---|---|---|---|---|
| | Nitrogen Content (wt %) | 7.5 | 14.0 | 13.3 | 13.8 | 14.0 | 10.1 | 10.2 |
| | Density (g/cm$^3$) | 2.66 | 3.01 | 3.03 | 2.75 | 2.75 | 2.73 | 2.73 |
| | Coefficient of Thermal Expansion ($\times 10^{-6}$/°C.) | 9.5 | 7.7 | 8.0 | 8.2 | 8.1 | 8.8 | 8.8 |
| | Coefficient of Thermal Conductivity (cal/cm · sec · °C.) | 0.27 | 0.19 | 0.19 | 0.23 | 0.23 | 0.25 | 0.25 |

| Cr(1) | Mn(1) | Fe(1) | Co(1) | Ni(1) | Cu(1) | Zn(1) | Zr(1) | Nb(1) | Mo(1) | W(1) |
|---|---|---|---|---|---|---|---|---|---|---|
| 11.0 | 10.4 | 13.8 | 10.5 | 12.9 | 12.8 | 10.1 | 10.2 | 10.5 | 10.4 | 10.1 |
| 2.75 | 2.74 | 2.78 | 2.73 | 2.78 | 2.78 | 2.73 | 2.73 | 2.73 | 2.74 | 2.74 |
| 8.7 | 8.8 | 8.5 | 8.9 | 8.6 | 8.6 | 8.9 | 8.9 | 8.8 | 8.8 | 8.9 |
| 0.24 | 0.25 | 0.23 | 0.25 | 0.23 | 0.24 | 0.25 | 0.24 | 0.24 | 0.24 | 0.24 |

| Mg(1) + Fe(1) | Mg(2) + Fe(2) | Fe(1) + Ni(1) | Fe(2) + Ni(2) | Fe(2) + Ni(2) + Mg(1) | Ni(10) | Fe(10) |
|---|---|---|---|---|---|---|
| 14.3 | 14.2 | 14.1 | 13.8 | 14.5 | 13.2 | 14.1 |
| 2.78 | 2.81 | 2.82 | 2.85 | 2.87 | 2.99 | 2.97 |
| 8.4 | 8.4 | 8.4 | 8.5 | 8.3 | 8.0 | 7.7 |
| 0.22 | 0.22 | 0.22 | 0.22 | 0.22 | 0.20 | 0.20 |

From the results shown in the table it can be understood that the coefficient of thermal expansion of the forged body fabricated by using Al-8 wt % Si-1 wt % Mg powder exceeds $10 \times 10^{-6}$/°C. The molten alloy of Al-54 wt % Si-1 wt % Mg could not be atomized. Therefore, it can be understood that in order to obtain a nitrided body having a desired nitrogen content, the molten Al alloy must contain at least 10 wt % and at most 50 wt % of Si.

From the results shown in the table above, it can be understood that nitriding is promoted by addition of any of the listed elements. It can be seen that among these elements, addition of Li, Mg, Fe, Ni, Cu or combination thereof increases the nitrogen content, and the rate of nitriding is accelerated.

The target low density of at most 3.0 g/cm$^3$, a high thermal conductivity of 0.2 cal/cm·sec·°C., and a coefficient of thermal expansion of $5 \times 10^{-6}$ to $10 \times 10^{-6}$/°C. can be obtained when the amount of the added element is at most 10 wt %. By contrast, if the added element exceeds 10 wt %, the aforementioned properties cannot be obtained.

The numerals in parentheses beside the added elements in Table 4 denote the wt % of the added element in the rapidly solidified powder.

Embodiment 8

Figure 13:
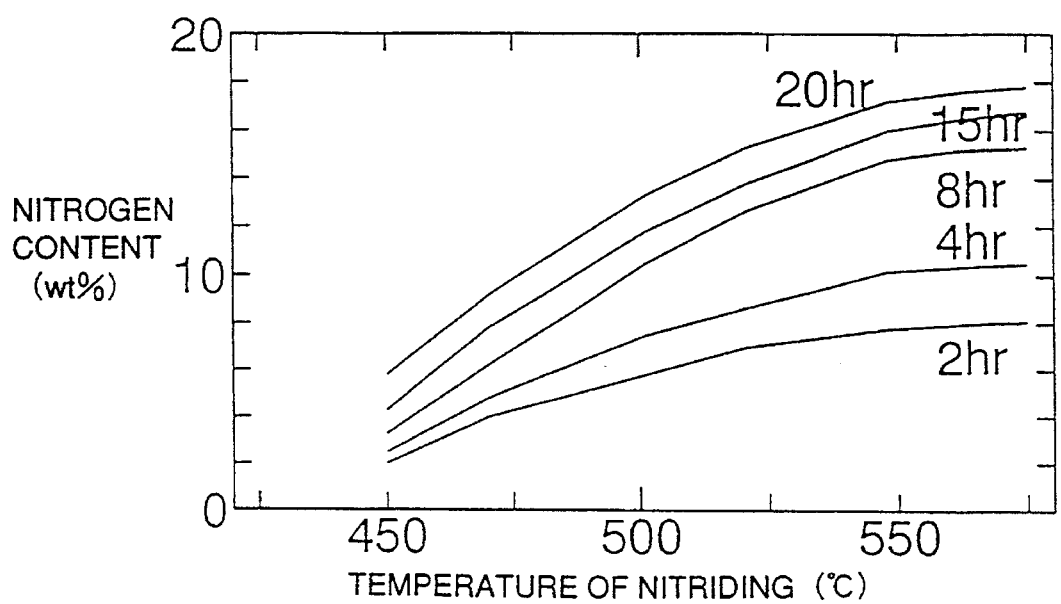
FIG. 13 is a graph showing the influence of the temperature and nitriding time on the amount of nitrogen in the nitrided body obtained according to the sixth Embodiment of the present invention.

A powder having the composition of Al-33 wt % Si-2 wt % Fe-2 wt % Ni-1 wt % Mg which resulted in a forged body having the highest nitrogen content among bodies formed from the powders fabricated in Embodiment 7. The powder with the just stated composition was sifted to provide a starting powder having a maximum grain diameter of at most 74 μm. The respective alloy powder had an average grain diameter of 32 μm. This powder was subjected to compression molding under a pressure of 2 t/cm$^2$ to form molded bodies having a relative density of 66% and dimensions of 10×10×15 mm. The molded bodies were nitrided for 2 to 20 hours at 450° C., 470° C., 501° C., 521° C., 548° C., 562° C. and 575° C., in a normal pressure atmosphere with a nitrogen partial pressure of at least 0.99 atm and a steam partial pressure of at most 0.005 atm. FIG. 13 shows the influence of the temperature and time of processing on the content of nitrogen in the nitrided bodies.

Referring to FIG. 13, when the nitriding is performed for 2 hours at a temperature lower than 475° C., the content of nitrogen in the nitrided body becomes smaller than 4 wt %. If the nitriding temperature exceeds 570° C., the molded body became soft and deformed during nitriding. When the nitriding temperature is 570° C. and nitriding is performed for more than 8 hours, the content of nitrogen in the nitrided body exceeds 15 wt %.

From the result of experimentation, it was found that the nitriding process must be performed for at least 2 hours and at most 8 hours at a temperature of from 475° C. to 570° C. in order to attain the desired nitrogen content in the nitrided body where a nitriding assistant element is added to the starting material as described above. It can be also understood that a nitrided body having a desired nitrogen content can be obtained when the temperature for nitriding is set relatively low, provided that the time for nitriding does not exceed 20 hours.

Embodiment 9

In manner similar to that of Embodiment 8, powder having the composition of Al-33 wt % Si-2 wt % Fe-2 wt % Ni-1 wt % Mg was sifted so as to have a maximum grain diameter of at most 74 μm. The resulting alloy powder had an average grain diameter of 32 μm. The powder was subjected to compression molding at a pressure of 2 t/cm$^2$ to form a molded body having a relative density of 66%, a diameter of 98 mm and a thickness of 50 mm. The molded body was nitrided for 4 hours at 540° C. in a normal pressure atmosphere with a nitrogen partial pressure of at least 0.99 atm and a steam partial pressure of at most 0.005 atm, whereby a nitrogen content of 10.8 wt % was obtained which amounts to an AlN equivalent of 31.6 wt %.

For comparison, 31.6 wt % of a commercially available AlN powder having an average grain diameter of 0.8 μm was mixed with in the aforementioned Al-33 wt % Si-2 wt % Fe 2 wt % Ni-1 wt % Mg powder having an average grain diameter of 32 μm. Thereafter, an acetone solution of myristic acid was applied to the dies, respective powders were compression-molded at a pressure of 2.1 t/cm$^2$ to form tablet specimens having a relative density of about 70% and a diameter of 98 mm and a thickness of 50 mm. The resulting nitrided body and the molded body based on the mixing AlN powder with the starting powder were respectively heated to 500° C., and then inserted into forging dies having a diameter of 100 mm. The dies were preheated to 350° C. Thereafter, the nitrided body and molded body were consolidated with a pressure of 6 t/cm$^2$, using the forging dies. The relation between density, coefficients of thermal conductivity and coefficients of thermal expansion of the forging bodies were as shown in Table 5 below.

TABLE 5

|  | Nitrided Body | AlN Powder Added |
|---|---|---|
| Density (g/cm$^3$) | 2.86 | 2.78 |
| Coefficient of Thermal Expansion (× 10$^{-6}$/°C.) | 7.9 | 8.1 |
| Coefficient of Thermal Conductivity (cal/cm · sec · °C.) | 0.24 | 0.18 |

It can be understood from Table 5 that the forging body manufactured by adding AlN powder has an inferior hot moldability as compared with the nitrided body and the density was though it has the same composition. As a result, the coefficient of thermal conductivity was degraded as compared with that of the nitrided body, to be lower than 0.2 cal/cm·sec·°C.

Further, respective forged bodies were cut. The nitrided body could be cut to the desired shape. However, cutting of the comparison body was difficult, since it was chipped because of a non-uniform distribution of AlN. It is apparent that the nitrided body of the present invention has a superior cuttability. The reason for this may be the fact that in the present invention, AlN was produced by reaction, so that the particles are very fine and dispersed uniformly.

Further, it was found that in the present nitrided body having this composition, the amount of tool wear is very small. This may be due to addition of Fe and Ni which prevents movement of Si particles, due to the addition of Mg which shortens the time for nitriding, and due to the fact that both additives suppress the grain growth of Si.

Further, the forging bodies were cut into shapes with the dimension 30×20×5 mm and heated for 10 minutes at 850° C. The forged body of comparison was added could not retain its shape because of expansion and cracks. By contrast, the present nitrided body was not deformed at all. The reason for this superior heat resistance provided by the generation of AlN by reaction, may be the coating of the Al by the AlN.

Embodiment 10

An example in which the nitrogenous Al—Si powder metallurgical alloy of the present invention is used for an IC (Integrated Circuit) package will be described.

In this example, two nitrogenous Al—Si alloys with and without the aforementioned element(s) added were used for the IC package. The two different nitrogenous Al—Si alloys were prepared by the following methods <1> and <2>.

<1> Molten Al—Si alloy containing 45 wt % of Si was powdered by the air atomizing method. The powder was sifted so as to have the maximum grain diameter of at most 74 μm. In this manner, Al-45 wt % Si having an average grain diameter of 32 μm was prepared. Thereafter, an acetone solution of myristic acid was applied to the die, the powder was compression-molded with a pressure of 2.5 t/cm², and a tablet specimen having a diameter of 98 mm and a thickness of 50 mm with a relative density of about 70% was fabricated.

The molded body was nitrided for 8 hours at 540° C. in a normal pressure atmosphere with a nitrogen partial pressure of at least 0.99 atm and a steam partial pressure of at most 0.005 atm. The measured content of nitrogen in the nitrided body was 7.5 wt % and 22 wt % in AlN equivalent. The nitrided body was heated to 500° C., and inserted into a forging die having a diameter of 100 mm. The die was preheated to 350° C. Thereafter, the nitrided body was consolidated with pressure bearing of 6 t/cm² using the forging die, whereby a forging body having a relative density of 100% was fabricated.

The property values of the forging body were as follows. The density was 2.60 g/cm³, the coefficient of thermal expansion was $8.2 \times 10^{-6}$/°C., and the coefficient of thermal conductivity was 0.24 cal/cm·sec·°C. The forged body was cut to a desired shape.

<2> A nitrogenous Al—Si alloy was prepared by adding the elements of 2 wt % Fe-2 wt % Ni-1 wt % Mg to the starting material of Al-33 wt % Si. The samples were fabricated as in Embodiment 9 above. The forged body was cut to the desired shape.

Figure 14:
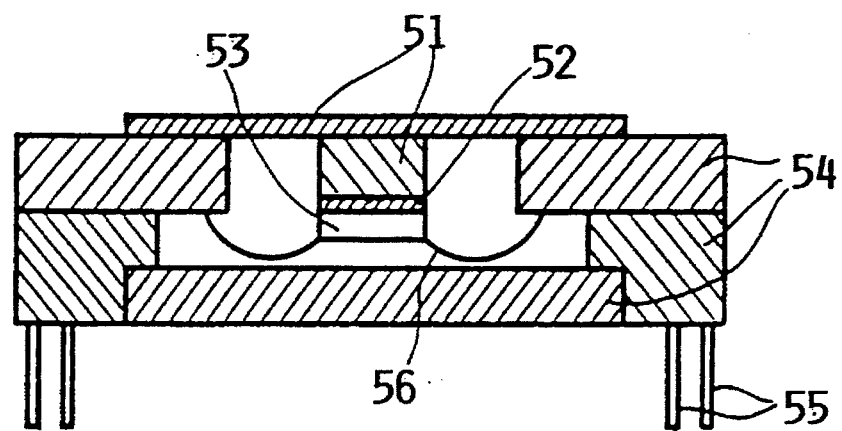
FIG. 14 is a cross section schematically showing an IC package structure made of the nitrogenous Al—Si powder metallurgical alloy of the present invention.
Figure 15:
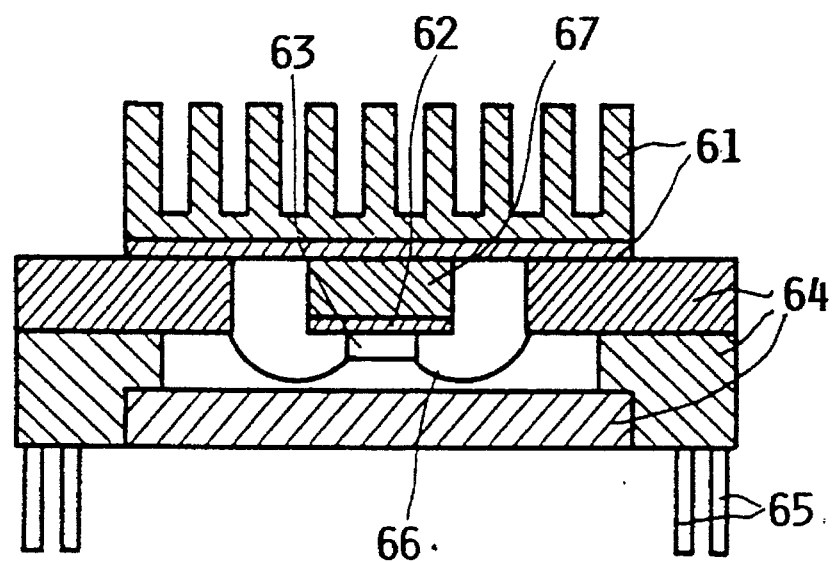
FIG. 15 is a cross section schematically showing another IC package structure made of the nitrogenous Al—Si powder metallurgical alloy of the present invention.
Figure 16:
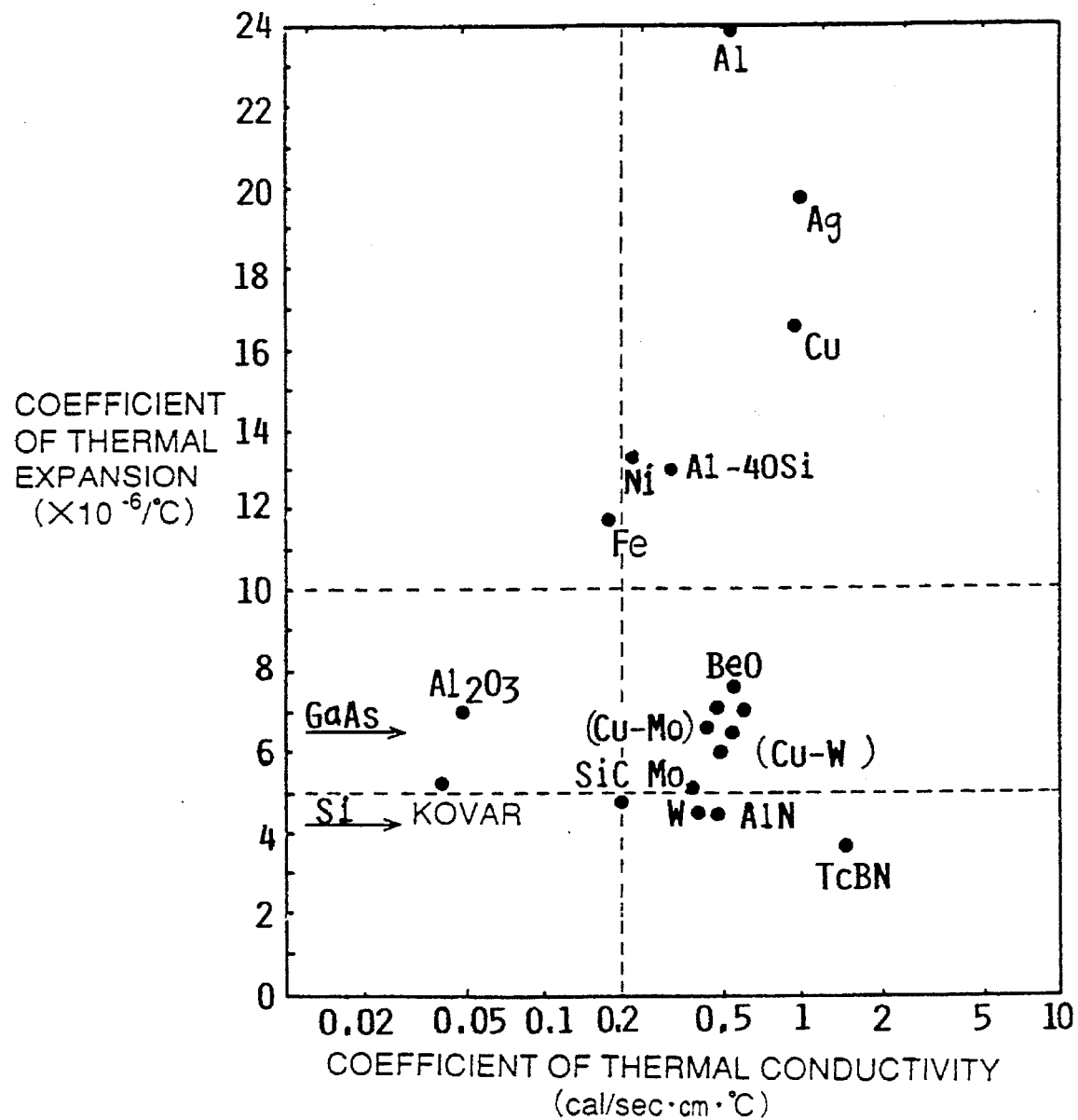
FIG. 16 shows the relationship between the coefficients of thermal conductivity and coefficients of thermal expansion of various materials.

FIGS. 14 and 15 are cross sections schematically showing the structures of the nitrogenous Al—Si alloy of the present invention used for the IC package. First, referring to FIG. 14, the IC package includes a substrate 51, a solder 52, a semiconductor chip 53, an enclosure 54, a lead out electrode 55 and a bonding wire 56. The substrate was mounted on a top surface of the enclosure 54 of ceramics such as alumina. Substrate 51 is formed of the forged body processed in accordance with the above described method <1> and was further subjected to an anodic oxidation. A semiconductor chip 53 is bonded to a lower portion of the substrate 51 by means of solder 52. One end of the bonding wire 56 is connected to a pad portion (not shown) of the semiconductor chip 53, and the other end of the bonding wire 56 is connected to a terminal (not shown) formed on the enclosure 54. This terminal is electrically connected to lead out terminal 55 of covar wire.

Referring to FIG. 15, the IC package can be distinguished from that of FIG. 14 especially by the substrates 61 and 67. More specifically, the substrate 61 is attached to the top surface of enclosure 64 and has a fin-like shape so as to promote cooling, and it is formed of the forged body machined in accordance with the above described method. The substrate 61 is plated with Ni. The substrate 67 positioned between substrate 61 and semiconductor chip 63 (solder 62) is formed, for example, of a copper (Cu) - tungsten (W) alloy. The substrates 61 and 67 are bonded to each other by brazing which requires a brazing temperature of 800° C. Such a brazing which was not temperature could not be used heretofore for an alloy containing Al. Except for the brazing, the IC package of FIG. 15 is similar to that of FIG. 14, and therefore a detailed description thereof is not repeated.

As shown in FIGS. 14 and 15, the materials prepared in the manner described in methods <1> and <2> were used for the substrates 51 and 67 in the present embodiment. These substrates have thermal expansion coefficients which are close to that of alumina ($Al_2O_3$) which is the material of the enclosure 54 or 64, and that of silicon which is the main material of the semiconductor chip 63. Therefore, strain derived from thermal stress is hardly generated during the steps of mounting the IC. Since substrates 51 and 61 have superior heat radiation, the IC packages have a long life and are highly reliable.

A heat-resistance test performed for 15 minutes at 200° C. and a heat cycle test of 100 cycles performed in the temperature range of −60° C. to 150° C. were applied to these two semiconductor elements. No malfunction was not observed at all.

The substrate 61 shown in FIG. 15 having a number of fins for cooling could be manufactured by pressure-molding the material at a pressure of 2.5 t/cm², with or without the nitriding assistant element(s) added after nitriding for 4 hours at 540° C. in a normal pressure atmosphere with a nitrogen partial pressure of at least 0.99 atm and a steam partial pressure of at most 0.005 atm, filling the material into an aluminum container and hot-extruding the same at a temperature of 450° C.

From the foregoing, it was found that the nitrogenous Al—Si powder metallurgical alloy containing at least 4 wt % and at most 15 wt % of nitrogen and the remaining part substantially consisting of Al, Si and unavoidable impurities, satisfies the conditions that it has the density of at most 3.0 g/cm³, a coefficient of thermal expansion of from $5 \times 10^{-6}$ to $10 \times 10^{-6}$/°C. and coefficient of thermal conductivity of at least 0.2 cal/cm·sec·°C. With the present nitrogenous Al—Si powder metallurgical alloy, a material has been obtained that is suitable for a making heat sinks, a semiconductor substrates, radiation substrates housings and the like. The material which is lightweight and has a low coefficient of thermal expansion and high coefficient of thermal conductivity.

Further, it was found that the nitrogenous Al—Si powder alloy containing at least 4 wt % to at most 15 wt % of nitrogen, at least 8.5 wt % and at most 48 wt % of silicon, at most 9.6 wt % of at least one element selected from the group consisting of Li, Mg, Ti, V, Cr, Mn, Fe, Co, Ni, Cu, Zn, Zr, Nb, Mo and W, and a remaining part essentially consisting of Al and unavoidable impurities also satisfies the conditions that it has the density of at most 3.0 g/cm³, a coefficient of thermal expansion within the range of $5 \times 10^{-6}$ to $10 \times 10^{-6}$/°C. and coefficient of thermal conductivity of at least 0.2 cal/cm·sec·°C. This material with the assistant element or elements added as described above is also suitable for making the above components since it has the required characteristics.

If at least one element selected from the group consisting of Li, Mg, Ti, V, Cr, Mn, Fe, Co, Ni, Cu, Zn, Zr, Nb, Mo and W is added to the alloyed powder, nitriding can be performed at a relatively low temperature in relatively short period of time, when a molded body of the alloyed powder is nitrided to obtain powder metallurgical alloy having the desired nitrogen content. These assistant elements suppress the grain growth of the powder metallurgical alloy and reduce the time necessary for the nitriding process.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitrogenous aluminum-silicon powder as a metallurgical alloy containing aluminum crystals and silicon crystals having a maximum grain diameter of 74 µm and an average grain diameter of 67 µm at the most, said alloy further containing nitrogen within the range of at least 4 wt % and at most 15 wt %, said nitrogen forming aluminum nitride grains (AlN) present on the surfaces of said aluminum and silicon crystals and in an interface between said aluminum and silicon crystals, said alloy further containing a remainder consisting essentially of aluminum, silicon and unavoidable impurities.

2. The alloy of claim 1, includes a nitride, at least 90 wt % of said nitride consisting of said AlN.

3. The alloy of claim 1, wherein said silicon is present in said alloy within the range of at least 8.5 wt % to 48 wt % at most.

4. The alloy of claim 1, further comprising at least one element selected from the group consisting of Li, Mg, Ti, V, Cr, Mn, Fe, Co, Ni, Cu, Zn, Zr, Nb, Mo and W, as a nitriding assistant which is present in an amount up to 9.6 wt % at most.

5. The alloy of claim 1, having a density of at most 3.0 g/cm$^3$, a thermal expansion coefficient in the range of $5\times10^{-6}$ to $10\times10^{-6}$/°C., and a thermal conductivity coefficient of at least 0.2 cal/cm·sec·°C.

6. A nitrogenous aluminum-silicon powder as a metallurgical alloy containing aluminum crystals and silicon crystals having a maximum grain diameter of 74 μm and an average grain diameter of 67 μm at the most, said alloy further containing nitrogen within the range of at least 4 wt % and at most 15 wt %, said nitrogen forming aluminum nitride grains (AlN) present on the surfaces of said aluminum and silicon crystals and in an interface between said aluminum and silicon crystals, wherein said silicon is present within the range of at least 8.5 wt % to 48 wt % at most, said alloy further comprising at least one element selected from the group consisting of Li, Mg, Ti, V, Cr, Mn, Fe, Co, Ni, Cu, Zn, Zr, Nb, Mo and W, and a remainder formed essentially by said aluminum and unavoidable impurities.

7. The alloy of claim 6, including a nitride, at least 90 wt % of said nitride consisting of said AlN.

8. The alloy of claim 6, having a density of at most 3.0 g/cm$^3$, a thermal expansion coefficient in the range of $5\times10^{-6}$ to $10\times10^{-6}$/°C., and a thermal conductivity coefficient of at least 0.2 cal/cm·sec·°C.

\* \* \* \* \*

UNITED STATES PATENT AND TRADEMARK OFFICE
CERTIFICATE OF CORRECTION

PATENT NO. : 5,605,558  Page 1 of 3
DATED : February 25, 1997
INVENTOR(S) : Shin-ichi Yamagata et al.

It is certified that error appears in the above-indentified patent and that said Letters Patent is hereby corrected as shown below:

Col. 1, line 46, after "$Al_2O_3$" insert --,--;
      line 47, delete "being";

Col. 2, line 19, after "result," delete "in";
      line 24, after "because of" insert --the--;
      line 28, replace "permit" by --permits--;
      line 42, after "period of time at" delete "a";

Col. 3, line 55, delete "nitrogenous Al-Si powder"

Col. 5, line 38, after "molded body" delete ",";
      line 43, replace "Ng" by --Mg--;

Col. 7, line 22, replace "The normal pressure refers" by --The "normal pressure" refers--;

Col. 9, line 15, after "molding on" insert --the--;

Col. 10, line 27, after "compression" insert --bodies--;
      line 29, replace "body was" by --bodies were--;

UNITED STATES PATENT AND TRADEMARK OFFICE
CERTIFICATE OF CORRECTION

PATENT NO. : 5,605,558

DATED : February 25, 1997

INVENTOR(S) : Shin-ichi Yamagata et al.

It is certified that error appears in the above-indentified patent and that said Letters Patent is hereby corrected as shown below:

Col. 12, line 48, after "temperature" delete ",";
      line 49, after "atmosphere" insert ",";
      line 54, after "comparing" insert ",";

Col. 14, line 14, replace "and an" by --at--;
      line 16, replace "at" by --and--;
      line 35, replace "of" by --temperatures from--;
      line 36, replace "temperatures from" by --of--;
      line 66, after "Thus" insert --,--;

Col. 15, line 18, replace "forging bodies" by --forged bodies--;

Col. 16, line 62, replace "combination" by --combinations--;

Col. 18, line 26, after "density was" insert --reduced--;
      line 40, after "due to" insert --the--;
      line 46, delete "was added";

Col. 19, line 55, delete "which was not";

UNITED STATES PATENT AND TRADEMARK OFFICE
CERTIFICATE OF CORRECTION

PATENT NO.    : 5,605,558
DATED         : February 25, 1997
INVENTOR(S)   : Shin-ichi Yamagata et al.

It is certified that error appears in the above-indentified patent and that said Letters Patent is hereby corrected as shown below:

Col. 20, line 7, delete "not";
line 28, after "sinks," delete "a";
line 29, after "radiation substrates" insert ",";
line 30, delete "which".

Signed and Sealed this

Seventeenth Day of June, 1997

Attest:

BRUCE LEHMAN

Attesting Officer

Commissioner of Patents and Trademarks